(12) United States Patent
Heo et al.

(10) Patent No.: US 11,387,278 B2
(45) Date of Patent: Jul. 12, 2022

(54) ELECTRONIC DEVICES AND METHODS OF MANUFACTURING THE SAME

(71) Applicant: Samsung Electronics Co., Ltd., Suwon-si (KR)

(72) Inventors: Chui Joon Heo, Busan (KR); Ryuichi Satoh, Shizuoka (JP); Kyung Bae Park, Hwaseong-si (KR); Yeon-Hee Kim, Seoul (KR); Takkyun Ro, Hwaseong-si (KR); Takao Motoyama, Hwaseong-si (KR); Se Hyuck Park, Incheon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 457 days.

(21) Appl. No.: 15/824,177

(22) Filed: Nov. 28, 2017

(65) Prior Publication Data
US 2018/0182812 A1    Jun. 28, 2018

(30) Foreign Application Priority Data
Dec. 23, 2016 (KR) .................. 10-2016-0178267

(51) Int. Cl.
*H01L 27/30* (2006.01)
*H01L 51/44* (2006.01)
*H01L 27/146* (2006.01)

(52) U.S. Cl.
CPC ........ *H01L 27/307* (2013.01); *H01L 27/1462* (2013.01); *H01L 27/14632* (2013.01); *H01L 27/14643* (2013.01); *H01L 27/14665* (2013.01); *H01L 51/442* (2013.01); *H01L 51/448* (2013.01)

(58) Field of Classification Search
CPC ................. H01L 51/448; H01L 51/524; H01L 27/14643
See application file for complete search history.

(56) References Cited

U.S. PATENT DOCUMENTS

| 9,300,891 B2 | 3/2016 | Isono et al. |
| 2002/0132461 A1 | 9/2002 | Kizaki |
| 2010/0059803 A1* | 3/2010 | Gidon ............... H01L 27/14625 257/292 |
| 2011/0049591 A1 | 3/2011 | Nakatani et al. |

(Continued)

FOREIGN PATENT DOCUMENTS

| CN | 102420236 A | 4/2012 |
| CN | 103999222 A | 8/2014 |

(Continued)

OTHER PUBLICATIONS

Machine translation of JP 5683245 B2 which is the patent of JP 2012-124343.*

(Continued)

*Primary Examiner* — Vincent Wall
(74) *Attorney, Agent, or Firm* — Harness, Dickey & Pierce, P.L.C.

(57) ABSTRACT

An electronic device includes a plurality of pixel electrodes, an active layer on the plurality of pixel electrodes, an opposed electrode on the active layer and covering an entirety of an upper surface of the active layer, and a first encapsulation film on the opposed electrode wherein the opposed electrode and the first encapsulation film have a common planar shapes.

32 Claims, 22 Drawing Sheets

(56) References Cited

U.S. PATENT DOCUMENTS

| | | | | |
|---|---|---|---|---|
| 2011/0241151 | A1* | 10/2011 | Nakatani | H01L 27/307 257/443 |
| 2013/0320309 | A1* | 12/2013 | Kim | H01L 51/441 257/40 |
| 2014/0001454 | A1* | 1/2014 | Miyanami | H01L 27/286 257/40 |
| 2014/0070189 | A1* | 3/2014 | Leem | H01L 51/442 257/40 |
| 2014/0138522 | A1* | 5/2014 | Hamano | C23C 14/26 250/208.1 |
| 2014/0231782 | A1 | 8/2014 | Imai et al. | |
| 2015/0115243 | A1* | 4/2015 | Miyanami | H01L 27/307 257/40 |
| 2015/0162548 | A1* | 6/2015 | Lim | H01L 51/0072 257/40 |
| 2015/0200226 | A1* | 7/2015 | Jin | H01L 27/14645 257/432 |
| 2015/0372036 | A1* | 12/2015 | Suh | H01L 27/1462 348/273 |
| 2016/0155975 | A1* | 6/2016 | Jin | H01L 51/447 257/40 |
| 2016/0204378 | A1 | 7/2016 | Popp et al. | |
| 2016/0372520 | A1* | 12/2016 | Joei | H01L 51/448 |
| 2017/0324065 | A1* | 11/2017 | Lang | H01L 51/5268 |

FOREIGN PATENT DOCUMENTS

| | | |
|---|---|---|
| CN | 104009158 A | 8/2014 |
| JP | 2011-228648 A | 11/2011 |
| JP | 2013-135122 A | 7/2013 |
| JP | 2014-053310 A | 3/2014 |
| JP | 5683245 B2 | 3/2015 |
| KR | 20150066616 A | 6/2015 |

OTHER PUBLICATIONS

Machine translation of JP 2012124343.*
Search Report for corresponding European Application No. 17208665.4 dated May 23, 2018.
Notice of Reasons for Refusal dated Oct. 5, 2021 in Japanese Patent Application No. 2017-242607.
Office Action dated Jul. 14, 2021 in Chinese Application No. 201711391838.8.
First Office Action dated Dec. 31, 2020 in Chinese Application No. 201711391838.8.

* cited by examiner

ELECTRONIC DEVICES AND METHODS OF MANUFACTURING THE SAME

CROSS-REFERENCE TO RELATED APPLICATIONS

This application claims priority to and the benefit of, under 35 U.S.C. § 119, Korean Patent Application No. 10-2016-0178267 filed in the Korean Intellectual Property Office on Dec. 23, 2016, the entire contents of which are incorporated herein by reference.

BACKGROUND

1. Field

Electronic devices and methods of manufacturing the same are disclosed.

2. Description of the Related Art

Photoelectric devices may convert light into one or more electrical signals based on utilizing photoelectric effects. An individual photoelectric device may include a photodiode, a phototransistor, and the like. An individual photoelectric device may be applied to ("included in") an electronic device, where an electronic device may include an image sensor, a solar cell, an organic light emitting diode, and the like.

Miniaturization ("down-sizing") of electronic devices is desirable to enable improved compactness, portability, integration, and/or utility of electronic devices. Recently, research on new processes and structures for down-sizing electronic devices and thereby realizing high integration of electronic devices has been made.

SUMMARY

Some example embodiments provide an electronic device having a novel structure by using a novel process.

Some example embodiments provide a method of manufacturing the electronic device.

According to some example embodiments, an electronic device may include a plurality of pixel electrodes, an active layer on the plurality of pixel electrodes, an opposed electrode on the active layer and covering an entirety of an upper surface of the active layer, and a first encapsulation film on the opposed electrode. The opposed electrode and the first encapsulation film may have a common planar shape.

A vertical area of the opposed electrode may be larger than a vertical area of the active layer.

A gap between one edge of the opposed electrode and one edge of the active layer may be about 1 µm to about 100 µm.

The opposed electrode may cover the upper surface of the active layer and a plurality of side surfaces of the active layer.

The first encapsulation film may include a material that is one material of an oxide, a nitride, or an oxynitride. The material may include at least one element of aluminum, titanium, zirconium, hafnium, tantalum, and silicon.

The first encapsulation film may have a thickness of about 2 nm to about 30 nm.

The electronic device may include a second encapsulation film on the first encapsulation film. The second encapsulation film may have a common planar shape as the opposed electrode and the first encapsulation film. The second encapsulation film may include a common material in relation to the first encapsulation film. The second encapsulation film may have a different film quality in relation to a film quality of the first encapsulation film. The second encapsulation film may have a greater film density than a film density of the first encapsulation film. The second encapsulation film may include a different material from a material of the first encapsulation film.

The first encapsulation film may include one material of an oxide, a nitride, or an oxynitride, the one material included in the first encapsulation film including at least one element of aluminum, titanium, zirconium, hafnium, and tantalum, and the second encapsulation film may include one material of an oxide, a nitride, or an oxynitride, the one material included in the second encapsulation film including silicon.

The second encapsulation film may be thicker than the first encapsulation film, and the second encapsulation film has a thickness of about 10 nm to about 200 nm.

The electronic device may include a third encapsulation film covering the second encapsulation film. The third encapsulation film may include one material of an oxide, a nitride, an oxynitride, an organic material, or an organic/inorganic composite.

The active layer may be a light-absorbing layer that is configured to selectively absorb light in one wavelength spectrum of light of a red wavelength spectrum of light, a green wavelength spectrum of light, and a blue wavelength spectrum of light.

The electronic device may include a semiconductor substrate under the plurality of pixel electrodes. The semiconductor substrate may include a plurality of photo-sensing devices vertically overlapping with the plurality of pixel electrodes.

The electronic device may include a color filter layer between the plurality of pixel electrodes and the semiconductor substrate.

An electronic apparatus may include the electronic device.

According to some example embodiments, a method of manufacturing an electronic device may include forming a pixel electrode, forming an active layer on the pixel electrode, forming a conductive layer associated with an opposed electrode on the active layer, forming a thin film associated with a first encapsulation film on the conductive layer associated with the opposed electrode, and simultaneously or sequentially etching the thin film associated with the first encapsulation film and the conductive layer associated with the opposed electrode to form the first encapsulation film and the opposed electrode, such that the first encapsulation film and the opposed electrode have a common planar shape.

The etching may be performed based on at least one process of photolithography and dry etching.

The method may include forming a thin film associated with a second encapsulation film subsequently to forming the thin film associated with the first encapsulation film.

The thin film associated with the second encapsulation film, the thin film associated with the first encapsulation film, and the conductive layer associated with the opposed electrode may be simultaneously or sequentially etched to form the second encapsulation film, the first encapsulation film, and the opposed electrode such that the second encapsulation film, the first encapsulation film, and the opposed electrode have the common planar shape.

The second encapsulation film may be formed at a higher temperature than the first encapsulation film.

The first encapsulation film may be formed at less than or equal to about 110° C., and the second encapsulation film may be formed at less than or equal to about 220° C.

The method may include forming a third encapsulation film on the second encapsulation film.

According to some example embodiments, an electronic device may include a semiconductor substrate, a plurality of photo-sensing devices integrated into the semiconductor substrate, and a photoelectric device on the semiconductor substrate, the photoelectric device including a plurality of pixel electrodes on the semiconductor substrate, each pixel electrode vertically overlapping a separate set of one or more photo-sensing devices of the plurality of photo-sensing devices, an active layer on the plurality of pixel electrodes, and an opposed electrode on the active layer and covering an entirety of an upper surface of the active layer. The electronic device may further include a first encapsulation film on the opposed electrode, wherein the opposed electrode and the first encapsulation film have a common planar shape.

The electronic device may include a color filter layer on the semiconductor substrate, the color filter layer including a plurality of color filters, each color filter of the plurality of color filters vertically overlapping a separate photo-sensing device of the plurality of photo-sensing devices.

The photoelectric device may be between the color filter layer and the plurality of photo-sensing devices. The active layer may be a light-absorbing layer that is configured to selectively absorb light in one wavelength spectrum of light of a red wavelength spectrum of light, a green wavelength spectrum of light, and a blue wavelength spectrum of light. Adjacent color filters of the plurality of color filters may be configured to selectively transmit different wavelength spectra of mixed light of a plurality of wavelength spectra of mixed light, the different wavelength spectra of mixed light including both the one wavelength spectrum of light and different additional wavelength spectra of light, respectively.

A vertical area of the opposed electrode may be larger than a vertical area of the active layer.

The first encapsulation film may include an oxide, a nitride, or an oxynitride.

The first encapsulation film may have a thickness of about 2 nm to about 30 nm.

The electronic device may include a second encapsulation film on the first encapsulation film.

DETAILED DESCRIPTION

Figure 1:
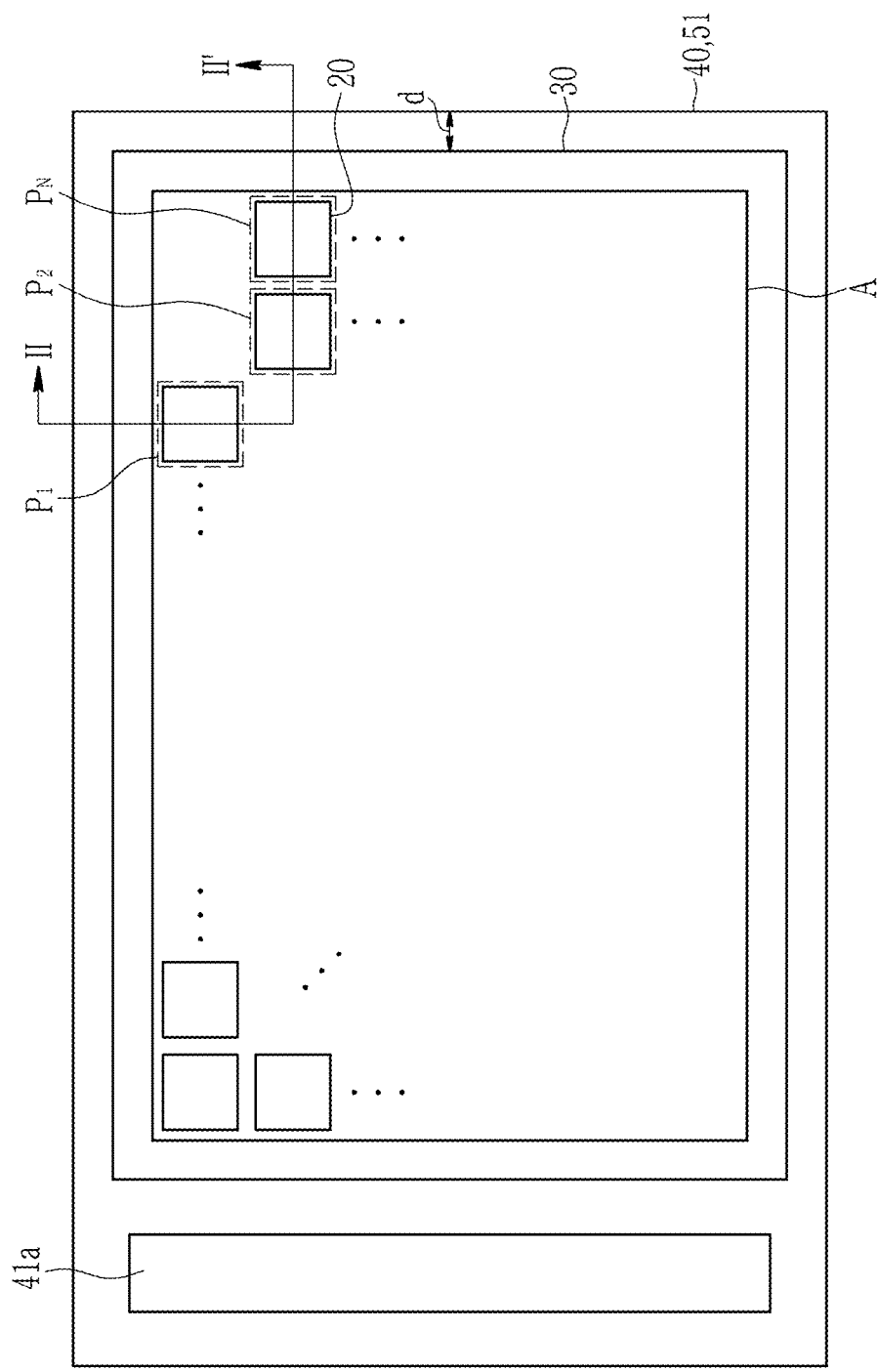
FIG. 1 is a schematic top plan view showing an electronic device according to some example embodiments.

Hereinafter, some example embodiments of the present disclosure will be described in detail so that a person skilled in the art would understand the same.

This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Furthermore, when an element is referred to as being "on" another element, it will be understood that the element may be above or below the other element.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an electronic device according to some example embodiments is described.

As an example of an electronic device, an image sensor is described but is not limited thereto.

An electronic device according to some example embodiments may be a stack-type electronic device, for example a stack-type image sensor.

For example, a stack-type image sensor may have a stack structure where a lower structure and an upper structure are stacked in a vertical direction, for example a structure where at least one of a first photodetector, a second photodetector, and a third photodetector sensing light in a different wavelength spectrum of light is disposed in a upper structure. For example, each of the first photodetector, the second photodetector, and the third photodetector may selectively sense one of light in a red wavelength spectrum of light (hereinafter, 'red light'), light in a green wavelength spectrum of light (hereinafter, 'green light'), and light in a blue wavelength spectrum of light (hereinafter, 'blue light'). For example, each of the first photodetector, the second photodetector, and the third photodetector may selectively sense red light, blue light, and green light. For example each of the first photodetector, the second photodetector, and the third photodetector may selectively sense blue light, green light, and red light. For example each of the first photodetector, the second photodetector, and the third photodetector may selectively sense green light, red light, and blue light.

For example, a stack-type image sensor may consist of a lower structure including a first photodetector and a second photodetector and an upper structure including a third photodetector. The lower structure may include a first pixel including a first photodetector and a second pixel including a second photodetector which are alternately arranged along a row and/or a column, but arrangement orders and manners may be diverse. For example, the lower structure may include a substrate integrated with a first photodetector and a second photodetector and the upper structure may include a photoelectric device including a third photodetector.

Figure 2:
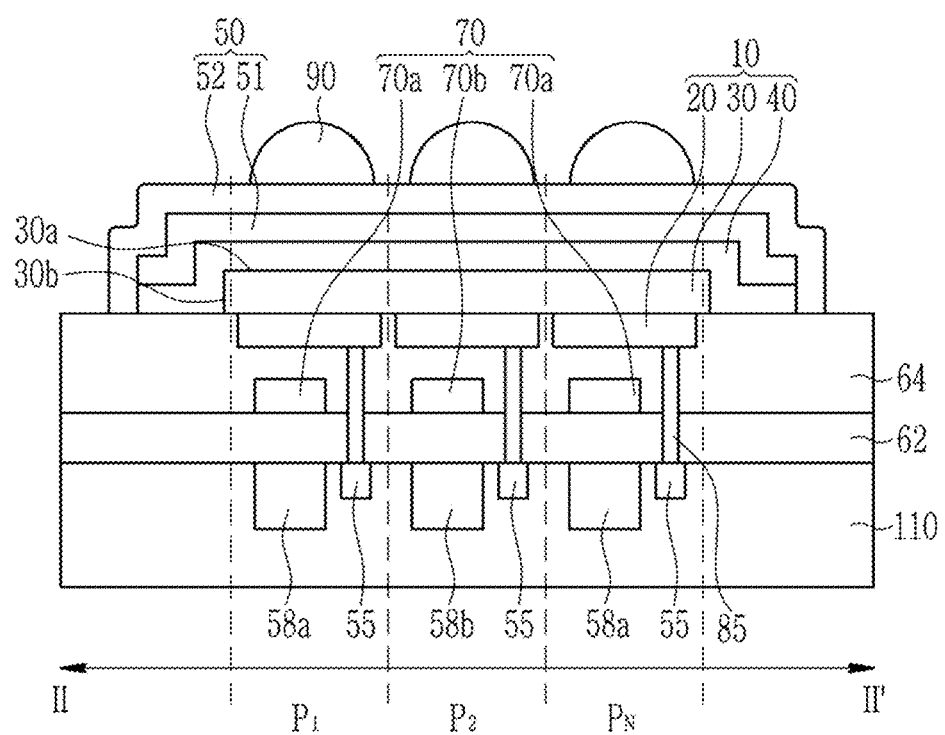
FIG. 2 is a schematic cross-sectional view showing the electronic device of FIG. 1 taken along cross-sectional view line II-II' according to some example embodiments.

FIG. 1 is a schematic top plan view showing an electronic device according to some example embodiments and FIG. 2 is a schematic cross-sectional view of the electronic device of FIG. 1 taken along a cross-sectional view line II-II' according to some example embodiments.

Referring to FIGS. 1 and 2, an electronic device according to some example embodiments includes a substrate 110, a lower insulation layer 62, an upper insulation layer 64, a color filter layer 70, a photoelectric device 10, an encapsulation film 50, and a set of lenses 90 (the set of lenses 90 may be referred to herein as simply an individual lens 90). In some example embodiments, the color filter layer 70 is absent.

The substrate 110 may be, for example, a semiconductor substrate, a silicon substrate, a silicon wafer, some combination thereof, or the like. As shown in at least FIG. 2, the substrate 110 may be integrated with photo-sensing devices 58a and 58b, a transmission transistor (not shown), and a charge storage 55, such that the photo-sensing devices 58a and 58b, transmission transistor, and charge storage 55 are encompassed (partially or entirely) within a volume defined by the outer surfaces of the substrate. Each photo-sensing device of the photo-sensing devices 58a and 58b may be a photodiode. The photo-sensing devices 58a and 58b, the transmission transistor, and the charge storage 55 may be integrated in each pixel.

The photo-sensing devices 58a and 58b may sense light and sensed information may be transferred by the transmission transistor. The charge storage 55 may electrically be connected to the photoelectric device 10 that will be described later and information of the charge storage 55 may be transferred by the transmission transistor. In some example embodiments, a photo-sensing device, including one or more of the photo-sensing devices 58a and 58b, may be configured to sense a particular wavelength spectrum of light. Separate photo-sensing devices (e.g., photo-sensing devices 58a and 58b) may be configured to sense different wavelength spectra of light. One or more photo-sensing devices may be configured to sense a particular wavelength spectrum of light (e.g., red wavelength spectrum of light, blue wavelength spectrum of light, green wavelength spectrum of light, mixed wavelength spectrum of light, etc.) in an absence of the color filter layer 70. For example, the one or more photo-sensing devices may be configured to sense a limited portion of the entire wavelength spectrum of light that is received at ("incident on") the one or more photo-sensing devices.

A metal wire (not shown) and a pad (not shown) are formed under the photo-sensing devices 58a and 58b. In order to decrease signal delay, the metal wire and pad may be made of ("at least partially comprise") a metal having low resistivity, for example, aluminum (Al), copper (Cu), silver (Ag), and alloys thereof, but are not limited thereto. Further, it is not limited to the structure, and the metal wire and pad (not shown) may be disposed at various positions, for example on the substrate 110.

A lower insulation layer 62 may be formed on the substrate 110. The lower insulation layer 62 may be made of an inorganic insulating material such as a silicon oxide and/or a silicon nitride, or a low dielectric constant (low K) material such as SiC, SiCOH, SiCO, and SiOF.

A color filter layer 70 may be formed on the lower insulation layer 62. The color filter layer 70 may include a first color filter 70a formed in a first pixel P1 and a second color filter 70b in a second pixel P2. For example, when a red photodetector configured to selectively sense red light and a blue photodetector configured to selectively sense blue light are included in a first pixel P1 and a second pixel P2, respectively, the first color filter 70a may be a red filter and the second color filter 70b may be a blue filter. The color filter layer 70 may be omitted as needed, and one or more of the photo-sensing devices 58a and 58b may be configured to sense a particular wavelength spectrum of light, and thus be configured to selectively sense a particular wavelength spectrum of light (e.g., red light, blue light, green light, mixed light, etc.) in the absence of the color filter layer 70.

As referred to herein, "red light" or light in a "red wavelength spectrum of light" may include light having a wavelength spectrum with a maximum absorption wavelength ($\lambda_{max}$) in a range of greater than about 600 nm to less than or equal to about 700 nm. For example, color filter 70a and/or color filter 70b may be a red filter configured to selectively transmit red light having a wavelength spectrum with a maximum absorption wavelength ($\lambda_{max}$) in a range of greater than about 600 nm to less than or equal to about 700 nm.

As referred to herein, "blue light" or light in a "blue wavelength spectrum of light" may include light having a wavelength spectrum with a maximum absorption wavelength ($\lambda_{max}$) in a range of greater than or equal to about 400 nm to less than or equal to about 500 nm. For example, color filter 70a and/or color filter 70b may be a blue filter configured to selectively transmit blue light having a wavelength spectrum with a maximum absorption wavelength ($\lambda_{max}$) in a range of greater than or equal to about 400 nm to less than or equal to about 500 nm.

As referred to herein, "green light" or light in a "green wavelength spectrum of light" may include light having a wavelength spectrum with a maximum absorption wavelength ($\lambda_{max}$) in a range of about 500 nm to about 600 nm. For example, color filter 70a and/or color filter 70b may be a green filter configured to selectively transmit green light having a wavelength spectrum with a maximum absorption wavelength ($\lambda_{max}$) in a range of about 500 nm to about 600 nm.

An upper insulation layer 64 is formed on the color filter layer 70. The formation of the upper insulation layer 64 may eliminate a step of smoothing an upper surface caused by forming the color filter layer 70, as the forming of the upper insulation layer 64 may cause the formation of a smooth upper surface 64a. The upper insulation layer 64 and the lower insulation layer 62 may include a contact hole (not shown) exposing a pad, and a trench 85 exposing the charge storage 55. The trench 85 may be filled with a filler. In some example embodiments, one of the lower insulation layer 62 and the upper insulation layer 64 may be omitted, such that the electronic device includes an individual insulation layer (that is one of layers 62 and 64) on substrate 110.

A photoelectric device 10 may be formed on the upper insulation layer 64.

The photoelectric device 10 includes a plurality of pixel electrodes 20, an active layer 30, and an opposed electrode 40.

One of the pixel electrode 20 and the opposed electrode 40 is an anode and the other is a cathode. At least one of the pixel electrode 20 and the opposed electrode 40 may be a light-transmitting electrode, and the light-transmitting electrode may be made of for example a transparent conductor such as indium tin oxide (ITO) or indium zinc oxide (IZO), or a metal thin film of a monolayer or a plural layer. For example, the pixel electrode 20 and the opposed electrode 40 may be light-transmitting electrodes.

The pixel electrode 20 is separated and arranged in each pixel and may be arranged along a row and/or a column in an active region (A). As shown in FIG. 2, each separate pixel electrode 20 may vertically overlap a separate one or more photo-sensing devices 58a and/or 58b of the plurality of photo-sensing devices 58a and 58b, such that the plurality of pixel electrodes 20 vertically overlap with the plurality of photo-sensing devices 58a and 58b.

The active layer 30 covers an entire surface of (e.g., an entirety of an upper surface s) the active region (A) and may be a single layer or a plural layer.

The active layer 30 may be a light-absorbing layer configured to selectively absorb light in one wavelength spectrum of light of a red wavelength spectrum of light, a green wavelength spectrum of light, and a blue wavelength spectrum of light. The active layer 30 may be a photoelectric conversion layer including a p-type semiconductor and an n-type semiconductor to form a pn junction. The active layer 30 may be an organic photoelectric conversion layer. The active layer 30 absorbs light flowed from outside to generate excitons and separate generated excitons into holes and electrons.

The active layer 30 includes a p-type semiconductor and an n-type semiconductor to form a pn junction and at least one of the p-type semiconductor and the n-type semiconductor may include an organic material selectively absorbing ("configured to selectively absorb") one wavelength spectrum of light of a red wavelength spectrum of light, a green wavelength spectrum of light, and a blue wavelength spectrum of light. For example, the organic material may have for example maximum absorption wavelength ($\lambda_{max}$) of about 500 nm to about 600 nm ("a green wavelength spectrum of light") and an energy bandgap of about 2.0 eV to about 2.5 eV.

The active layer 30 may include a p-type semiconductor and an n-type semiconductor in various ratios, and may include for example a p-type semiconductor and an n-type semiconductor in a volume ratio of about 1:9 to about 9:1, about 2:8 to about 8:2, about 3:7 to about 7:3, about 4:6 to about 6:4 or about 5:5.

For example, the active layer 30 may include a plurality of regions having a different composition ratio of a p-type semiconductor and an n-type semiconductor along a thickness direction. Herein, the composition ratio of the p-type semiconductor and the n-type semiconductor may be defined as a volume of the p-type semiconductor relative to a volume of the n-type semiconductor and may be expressed as p/n.

For example, the active layer 30 may include a first region, a second region, and a third region having a different composition ratio of a p-type semiconductor and an n-type semiconductor along a thickness direction, and a composition ratio ($p^2/n^2$) of a p-type semiconductor and an n-type semiconductor of the second region may be greater or smaller than a composition ratio ($p^1/n^1$) of a p-type semiconductor and an n-type semiconductor of the first region and a composition ratio ($p^3/n^3$) of a p-type semiconductor and an n-type semiconductor of the third region.

For example, the active layer 30 may include a first region and a second region having a different composition ratio of a p-type semiconductor and an n-type semiconductor along a thickness direction and the first region may be a p-type rich layer where a p-type semiconductor is included in a greater amount than a n-type semiconductor and the second region may have a smaller composition ratio of a p-type semiconductor and an n-type semiconductor than the first region. For example, within the ranges, the composition ratio ($p^1/n^1$) of the p-type semiconductor and the n-type semiconductor of the first region may be in the range: $1.0 < p^1/n^1 \leq 3.5$ and the composition ratio ($p^2/n^2$) of the p-type semiconductor and the n-type semiconductor of the second region may be in the range: $0.5 \leq p^2/n^2 \leq 1.2$, and within the ranges the composition ratio ($p^1/n^1$) of the p-type semiconductor and the n-type semiconductor of the first region may be in the range: $1.2 \leq p^1/n^1 \leq 3.5$ and the composition ratio ($p^2/n^2$) of the p-type semiconductor and the n-type semiconductor of the second region may be in the range: $0.8 \leq p^2/n^2 < 1.2$.

The active layer 30 may be for example various combinations such as an intrinsic layer (I layer), a p-type layer/I layer, an I layer/n-type layer, a p-type layer/I layer/n-type layer, a p-type layer/n-type layer, and the like.

In some example embodiments, the active layer 30 is configured to absorb (and thus the photoelectric device 10 may be configured to sense) light in an infrared and/or ultraviolet wavelength spectrum of light. Thus, the photoelectric device 10 may be an infrared sensor and/or ultraviolet sensor.

The opposed electrode 40 may be a common electrode.

As shown in FIG. 2, the opposed electrode 40 may have a larger vertical area and/or horizontal area than that of the active layer 30. For example, as shown in FIG. 1, opposed electrode 40 may have longer horizontal and vertical direction lengths than those of the active layer 30. For example, a gap (d) between one edge of the opposed electrode 40 and one edge of the active layer 30 may be less than or equal to about 100 μm, for example, about 1 μm to about 100 μm or about 5 μm to about 80 μm. According to this structure, and as shown in FIG. 2, the opposed electrode 40 may cover the entire upper surface 30a of the active layer 30 ("an entirety of an upper surface 30a of the active layer 30"), for example, may cover upper surface 30a and a plurality of side surfaces 30b of the active layer 30. In this way, the opposed electrode 40 entirely covering upper and side surfaces of the active layer 30 may prevent a direct exposure of the active layer 30 to heat, light, and/or a chemical liquid during a subsequent process and thus degradation of an organic material included in the active layer 30.

The opposed electrode 40 may be electrically connected to a pad and a wire through an opposed electrode-connecting layer 41a shown in FIG. 1.

A charge auxiliary layer (not shown) may be further included between the pixel electrode 20 and the active layer 30 and/or between the active layer 30 and the opposed electrode 40. The charge auxiliary layer may facilitate transfer of the separated holes and electrons in the active layer 30 and increase efficiency.

The charge auxiliary layer may include at least one of a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport, but is not limited thereto.

The charge auxiliary layer may include for example an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

An encapsulation film 50 is formed on the photoelectric device 10.

The encapsulation film 50 may protect the photoelectric device 10 thereon and may block or prevent inflow of oxygen and/or moisture from outside.

The encapsulation film 50 includes a lower encapsulation film 51 ("first encapsulation film") and an upper encapsulation film 52 ("second encapsulation film").

As shown in FIG. 2, the lower encapsulation film 51 may be directly on the opposed electrode 40 and may be etched with the same pattern as the opposed electrode 40. As a result, and as shown in FIG. 2, the lower encapsulation film 51 and the opposed electrode 40 may have a common or substantially common "planar shape" (e.g., a common planar shape within manufacturing tolerances and/or material tolerances). In some example embodiments, including the example embodiments shown in FIG. 2, both the lower encapsulation film 51 and the opposed electrode 40 may both have a common "C" planar shape. As shown in FIG. 2, for example, side (vertical) portions of each the lower encapsulation film 51 and the opposed electrode 40 extend over the respective elements on which the lower encapsulation film 51 and the opposed electrode 40 are disposed, and central (horizontal) portions of the lower encapsulation film 51 and the opposed electrode 40 each extend over an entirety of an upper surface of the respective elements on which the lower encapsulation film 51 and the opposed electrode 40 are disposed.

The lower encapsulation film 51 may include for example an oxide, a nitride, or an oxynitride, for example a material that is one material of an oxide, a nitride, or an oxynitride, the material including at least one element of aluminum (Al), titanium (Ti), zirconium (Zr), hafnium (Hf), tantalum (Ta), and silicon (Si).

The lower encapsulation film 51 may have for example a thickness of about 2 nm to about 30 nm, for example about 5 nm to about 25 nm. When it has a thin thickness within the ranges, close contacting properties between the lower encapsulation film 51 and the opposed electrode 40 may be increased and damage may be reduced or prevented during a simultaneous sequential etching process of the lower encapsulation film 51 and the opposed electrode 40.

The upper encapsulation film 52 that is on the lower encapsulation film 51 may cover the upper surface and/or a plurality of side surfaces of the lower encapsulation film 51 and the photoelectric device 10. As shown in FIG. 2, the upper encapsulation film 52 may have a common planar shape as the opposed electrode 40 and the lower encapsulation film 51. The upper encapsulation film 52 may have a different film quality in relation to a film quality of the lower encapsulation film 51. The upper encapsulation film 52 may have a greater film density than a film density of the lower encapsulation film 51. The upper encapsulation film 52 may include a different material from a material of the lower encapsulation film 51. The upper encapsulation film 52 may include for example an inorganic material, an organic material, an organic/inorganic material or combination thereof, for example an oxide, a nitride, an oxynitride, an organic material, or an organic/inorganic composite, or for example an oxide, a nitride, or an oxynitride including at least one of aluminum, titanium, zirconium, hafnium, tantalum, and silicon.

The lower encapsulation film 51 may include one material of an oxide, a nitride, or an oxynitride, the one material included in the lower encapsulation film 51 including at least one element of aluminum, titanium, zirconium, hafnium, and tantalum, and the upper encapsulation film 52 may include one material of an oxide, a nitride, or an oxynitride, the one material included in the upper encapsulation film 52 including silicon.

The upper encapsulation film 52 may be thicker than the lower encapsulation film 51, and the upper encapsulation film 52 may have a thickness of about 10 nm to about 200 nm.

A focusing lens 90 is formed on the encapsulation film 50.

The focusing lens 90 may control a direction of incident light, may gather the light in one region and may be disposed in a pixel area (A). The focusing lens 90 may have, for example, a shape of a cylinder or a hemisphere, but is not limited thereto.

As shown in FIGS. 1-2, multiple pixels P1 to PN may be included in the pixel area (A), wherein each pixel P1 to P2 includes a separate one of the photo-sensing devices 58a and 58b, separate portions of the substrate 110, the lower insulation layer 62, the upper insulation layer 64, the color filter layer 70, the photoelectric device 10, the encapsulation film 50, and a separate lens 90. As shown in FIG. 2, the boundaries between separate pixels may be a boundary that is equidistant between separate, adjacent photo-sensing devices 58a and 58b, a boundary that is equidistant between separate, adjacent pixel electrodes 20, a boundary that is equidistant between separate, adjacent color filters 70a and 70b, some combination thereof, or the like.

In some example embodiments, including the example embodiments shown in FIG. 2, adjacent color filters 70a and 70b in adjacent pixels may be configured to selectively transmit different wavelength spectra of light. In some example embodiments, including the example embodiments shown in FIG. 2, adjacent photo-sensing devices 58a and 58b in adjacent pixels may be configured to sense different wavelength spectra of light.

Hereinafter, referring to FIGS. 3 to 7, methods of manufacturing electronic devices of FIGS. 1 and 2 are for example described.

FIG. 3, FIG. 4, FIG. 5, FIG. 6, and FIG. 7 are cross-sectional views sequentially showing methods of manufacturing electronic devices of FIGS. 1 and 2.

Figure 3:
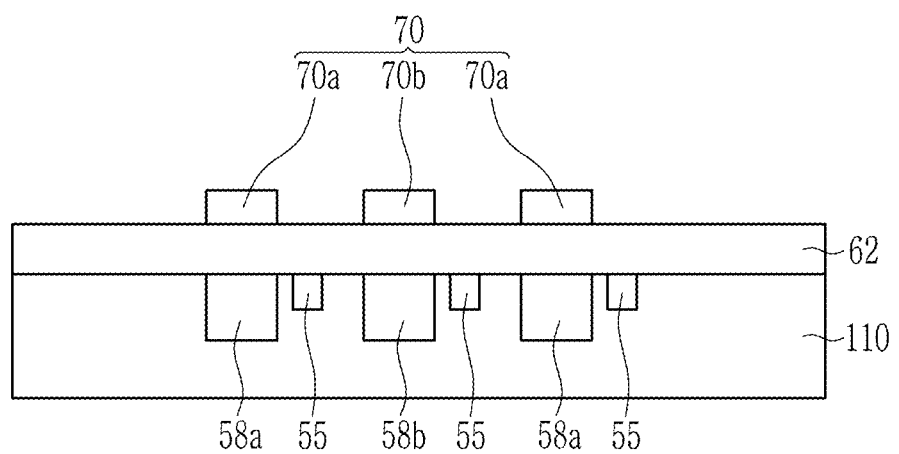
FIG. 3, FIG. 4, FIG. 5, FIG. 6, and FIG. 7 are cross-sectional views sequentially showing methods of manufacturing electronic devices of FIGS. 1 and 2.

First, referring to FIG. 3, a substrate 110 integrated with photo-sensing devices 58a and 58b, a transmission transistor (not shown), and a charge storage 55 is prepared. The substrate 110 may be for example a semiconductor substrate, for example a silicon wafer.

Subsequently, a lower insulation layer 62 and a color filter layer 70 are sequentially formed on the substrate 110.

Figure 4:
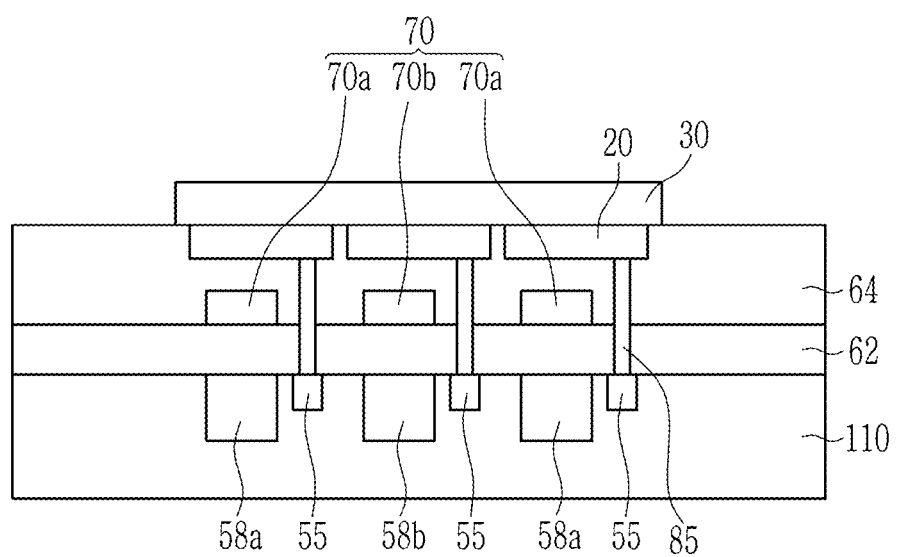

Then, referring to FIG. 4, an upper insulation layer 64 is formed on the color filter layer 70 and a plurality of trenches 85 penetrating the upper insulation layer 64 and the lower insulation layer 62 are formed. The trenches 85 are filled with fillers.

Subsequently, still referring to FIG. 4, a plurality of pixel electrodes 20 are formed on a surface of the upper insulation layer 64. The pixel electrode 20 may be for example made of a transparent conductor such as indium tin oxide (ITO) or indium zinc oxide (IZO), or a metal thin film of a monolayer or a plural layer, and may be for example formed by sputtering.

Subsequently, still referring to FIG. 4, an active layer 30 is formed on a plurality of pixel electrodes 20. The active layer 30 may be deposited on an entire surface of the active region (A) and may be for example by thermal deposition or chemical vapor deposition (CVD), for example thermal deposition or chemical vapor deposition (CVD) using a shadow mask.

Figure 5:
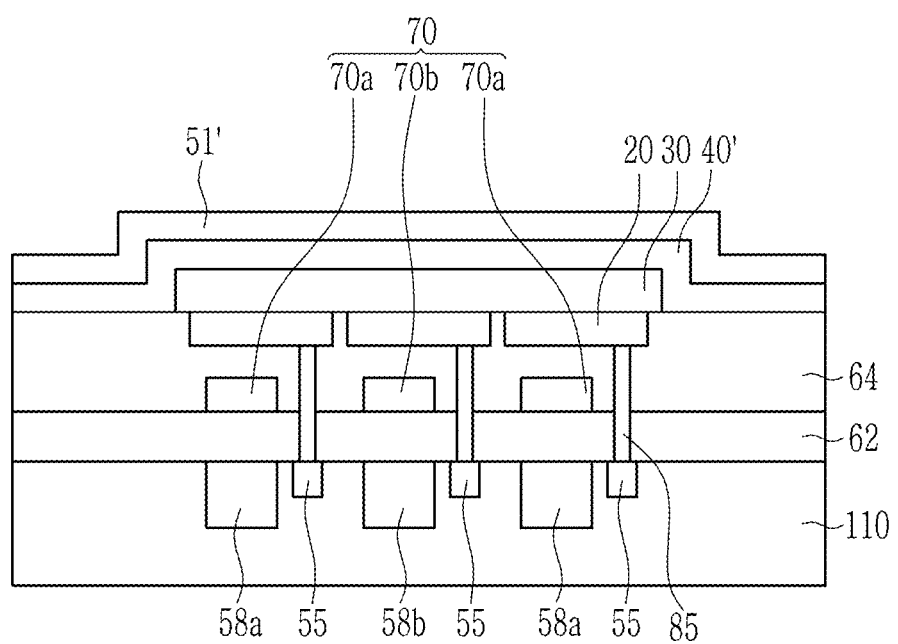

Next, referring to FIG. 5, a conductive layer 40' for an opposed electrode ("associated with an opposed electrode") is formed on the active layer 30. The conductive layer 40' for the opposed electrode may be made of a transparent conductor such as indium tin oxide (ITO) or indium zinc oxide (IZO), or a metal thin film of a monolayer or a plural layer. The conductive layer 40' for the opposed electrode may be for example formed by thermal deposition, chemical vapor deposition (CVD), atomic layer deposition, or sputtering, and may be formed on entire surfaces of the active layer 30 and the upper insulation layer 64 without using a separate shadow mask.

Subsequently, still referring to FIG. 5, a thin film 51' for a lower encapsulation film ("associated with a lower encapsulation film") is formed on the conductive layer 40' for the opposed electrode. The thin film 51' for the lower encapsulation film may include for example an oxide, a nitride, or an oxynitride including at least one of aluminum (Al), titanium (Ti), zirconium (Zr), hafnium (Hf), tantalum (Ta), and silicon (Si). The thin film 51' for the lower encapsulation film may be for example formed by thermal deposition, chemical vapor deposition (CVD), atomic layer deposition, or sputtering, and may be formed on entire surfaces of the conductive layer 40' for the opposed electrode without using a separate shadow mask.

Figure 6:
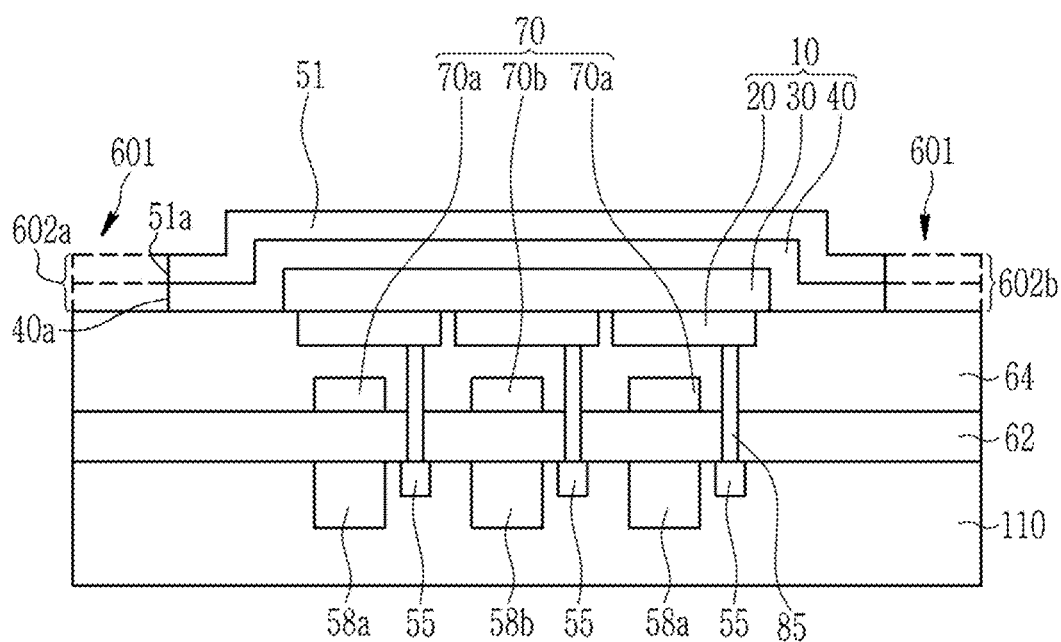

Next, referring to FIG. 6, the conductive layer 40' for the opposed electrode and the thin film 51' for the lower encapsulation film are simultaneously or sequentially etched. The etching 601 may be for example based on at least one process of and/or may be photolithography and/or dry etching, and is not particularly limited. The etching 601 may be performed by various methods and may be for example formed by once etching the thin film 51' for the lower encapsulation film and the conductive layer 40' for the opposed electrode using one etching mask, or formed by for example etching the thin film 51' for the lower encapsulation film using one etching mask to form a lower encapsulation film 51 and etching the conductive layer 40' for the opposed electrode using the lower encapsulation film 51 as a mask to form an opposed electrode 40. By such methods, the conductive layer 40' for the opposed electrode and the thin film 51' for the lower encapsulation film are etched together to form the opposed electrode 40 and the lower encapsulation film 51 having the substantially same planar shape. As shown in FIG. 6, performing the etching 601 to form the opposed electrode 40 and the lower encapsulation film 51 having the substantially same planar shape (e.g., a "C" shape as shown in FIG. 6) may include removing stacked edge portions 602a and 602b of the conductive layer 40' and thin film 51' such that only central respective portions thereof remain on the upper insulation layer 64 to form the opposed electrode 40 and the lower encapsulation film 51, wherein the outer sidewalls 40a of the opposed electrode 40 and the outer sidewalls 51a of the lower encapsulation film, formed by the etching 601, are coplanar or substantially coplanar (e.g., coplanar within manufacturing tolerances and/or material tolerances).

Figure 7:
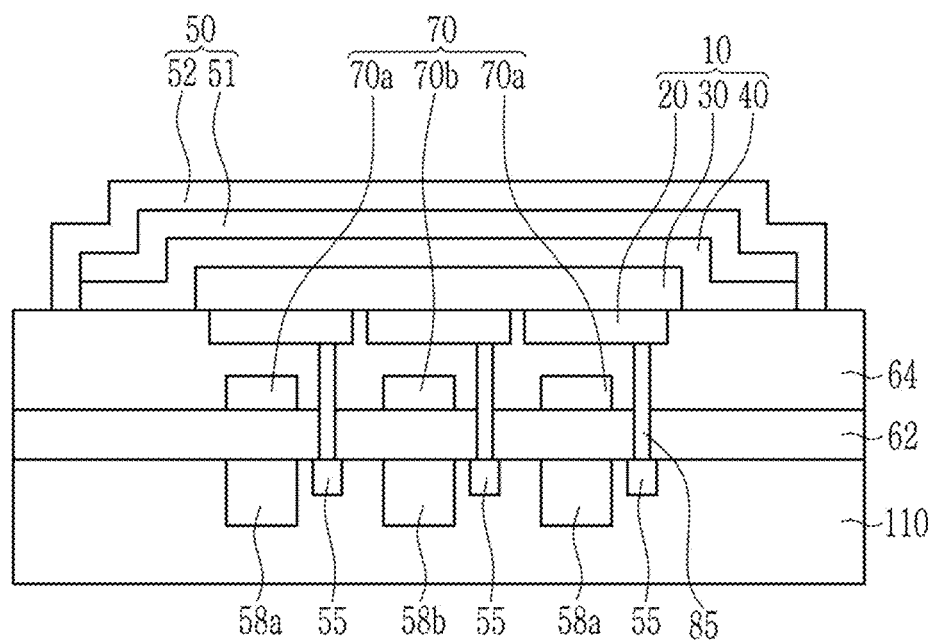

Next, referring to FIG. 7, a thin film (not shown) for an upper encapsulation film ("associated with an upper encapsulation film") is formed on the lower encapsulation film 51 and is patterned to form an upper encapsulation film 52. The thin film for the upper encapsulation film may include for example an oxide, a nitride, an oxynitride, an organic material, or an organic/inorganic composite. The thin film for the upper encapsulation film may be for example formed by thermal deposition or chemical vapor deposition (CVD) and is not particularly limited thereto. As shown in FIG. 7, the upper encapsulation film 52 may be formed to cover upper and side surfaces of the lower encapsulation film 51.

Next, referring to FIG. 2, a focusing lens 90 is formed on the upper encapsulation film 52.

As described above, an electronic device according to some example embodiments effectively protects the active layer by forming the opposed electrode 40 without using a shadow mask and simultaneously or sequentially etching the opposed electrode 40 and the lower encapsulation film 51, and thereby performance degradation of the electronic device may be prevented.

When a conventional method of forming the active layer 30 and the opposed electrode 40 by using a shadow mask is adopted, an electrode material attached on the shadow mask due to repetitive uses of the shadow mask may be deposited as particles along with the active layer 30 during formation of the active layer 30 and thus deteriorate performance of the active layer 30. In addition, a shadow effect due to use of the shadow mask may decrease uniformity of center and edge parts of a pattern and thus deteriorate performance of an electronic device.

In some example embodiments, the active layer 30 and the opposed electrode 40 may be separately formed and thus prevent performance degradation of the active layer 30 and the electronic device according to use of the shadow mask and simultaneously, freely determined to have each size and area and thus effectively disposed in a limited space. In addition, the conductive layer 40' for the opposed electrode is formed to entirely cover upper and side surfaces of the active layer 30 and thus may prevent a direct exposure of the active layer 30 to heat, light, and/or a chemical liquid in a subsequent process.

Furthermore, the opposed electrode 40 and the lower encapsulation film 51 may be simultaneously or sequentially etched to form a satisfactory pattern without an additional process.

Hereinafter, referring to FIGS. 8 and 9, an electronic device according to some example embodiments is described.

Figure 8:
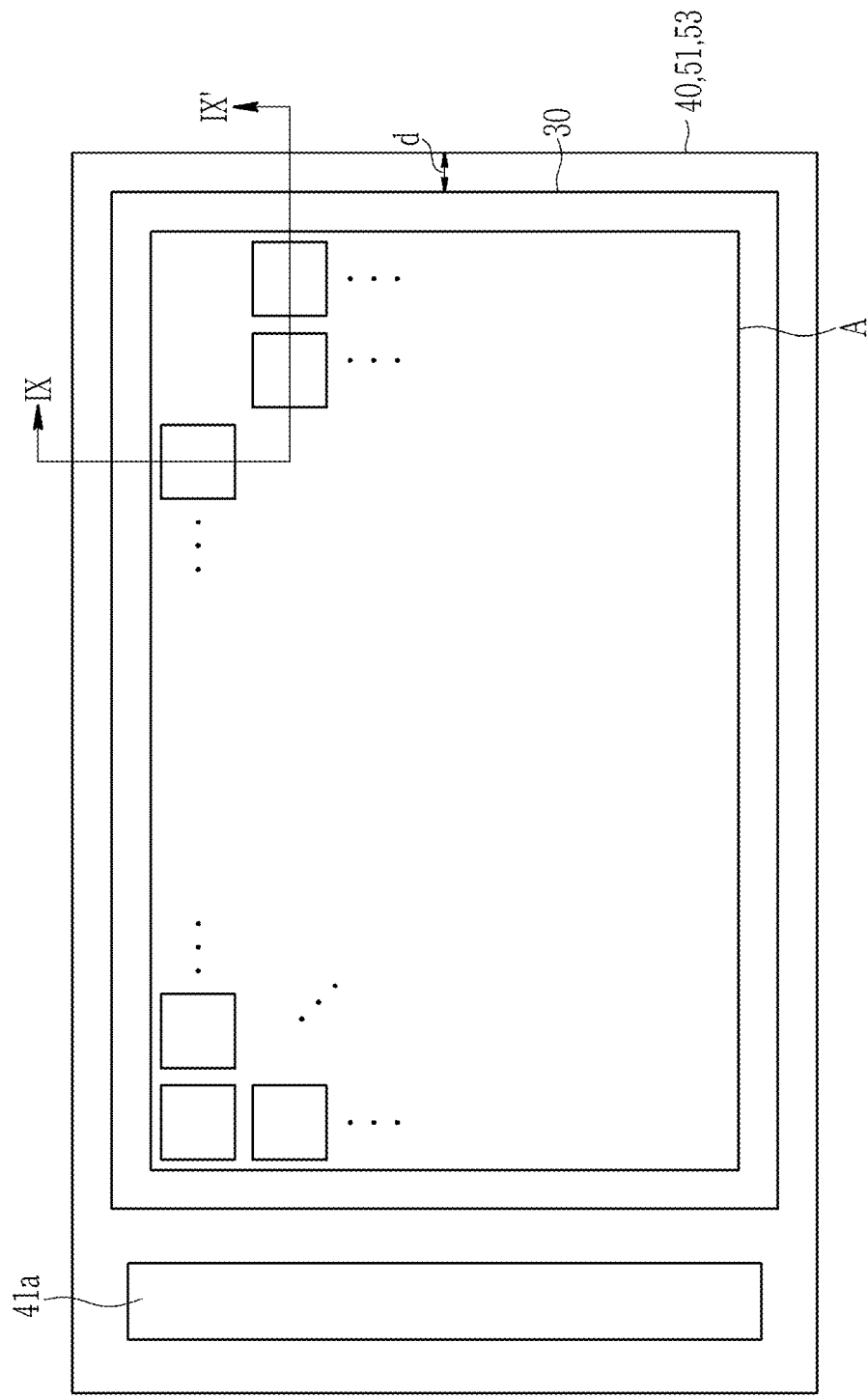
FIG. 8 is a schematic top plan view showing an electronic device according to some example embodiments.
Figure 9:
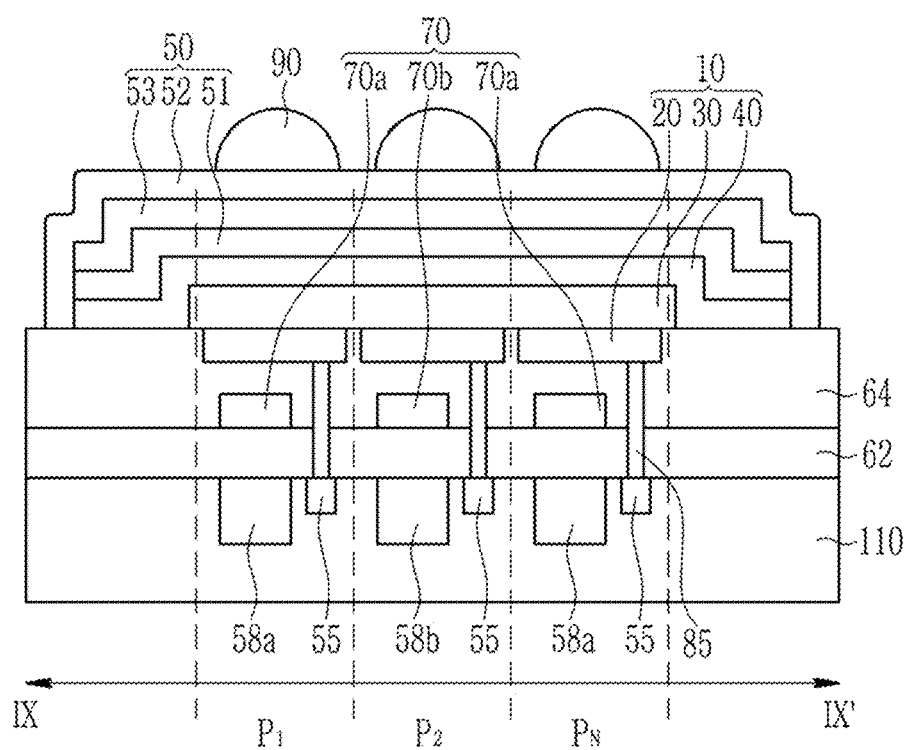
FIG. 9 is a schematic cross-sectional view showing the electronic device of FIG. 8 taken along cross-sectional view line IX-IX'.

FIG. 8 is a schematic top plan view showing an electronic device according to some example embodiments and FIG. 9 is a schematic cross-sectional view of the electronic device of FIG. 8 taken along cross-sectional view line IX-IX'.

Referring to FIGS. 8 and 9, an electronic device according to some example embodiments includes a substrate 110 integrated with photo-sensing devices 58a and 58b, a transmission transistor (not shown), and a charge storage 55; a lower insulation layer 62; an upper insulation layer 64; a color filter layer 70; a photoelectric device 10; and an encapsulation film 50, like some example embodiments.

However, in the electronic device according to some example embodiments, the encapsulation film 50 includes a lower encapsulation film 51, an intermediate encapsulation film 53, and an upper encapsulation film 52, unlike the electronic device according to some example embodiments.

The lower encapsulation film 51 and the intermediate encapsulation film 53 may include the same material or a different material.

For example, the lower encapsulation film 51 and the intermediate encapsulation film 53 may include the same material.

For example, the lower encapsulation film 51 and the intermediate encapsulation film 53 may be formed of the same material under a different process condition.

The lower encapsulation film 51 and the intermediate encapsulation film 53 may include for example an oxide, a nitride, or an oxynitride, for example an oxide, a nitride, or an oxynitride including at least one of aluminum (Al), titanium (Ti), zirconium (Zr), hafnium (Hf), tantalum (Ta), and silicon (Si).

The lower encapsulation film 51 and the intermediate encapsulation film 53 may be formed at a different process temperature.

For example, the lower encapsulation film 51 may be deposited at a temperature where an organic material included in the active layer 30 is not degraded, for example a temperature that is lower than a glass transition temperature ($T_g$) or a thermal deposition temperature ($T_d$) of an organic material.

The lower encapsulation film 51 may be for example deposited at about 110° C. or less or at a temperature of about 50° C. to about 110° C. The lower encapsulation film 51 may be for example formed by an atomic layer deposition method or a chemical vapor deposition (CVD) method within the temperature ranges.

Because the intermediate encapsulation film 53 is formed on the lower encapsulation film 51, a process temperature may be controlled regardless of degradation of the organic material included in the active layer 30. Therefore, a process margin of the intermediate encapsulation film 53 may be increased and an encapsulation film having a good quality may be formed without a limitation of a process temperature.

For example, the intermediate encapsulation film 53 may be deposited at a higher temperature than the lower encapsulation film 51, for example about 220° C. or less. Within the ranges, the intermediate encapsulation film 53 may be deposited at a temperature of about 80° C. to about 220° C. or about 100° C. to about 200° C. In this way, the intermediate encapsulation film 53 is deposited at a relatively high temperature and thereby a thin film having a desirable condition is formed and inflow of moisture and oxygen from outside may be effectively blocked.

In this way, since the lower encapsulation film 51 and the intermediate encapsulation film 53 are deposited at a different process temperature, thin films having a different film quality are formed. For example, the lower encapsulation film 51 and the intermediate encapsulation film 53 have different film density, roughness, and/or film color, and a difference of such film qualities may be confirmed by a transmission electron microscope (TEM).

For example, the intermediate encapsulation film 53 may have higher film density than the lower encapsulation film 51. For example, when the lower encapsulation film 51 and the intermediate encapsulation film 53 are formed of an aluminum oxide, the lower encapsulation film 51 may have film density of about 2.5 or greater and the intermediate encapsulation film 53 may have film density of about 2.8 or greater. However, the film density may be changed according to process conditions but is not limited thereto. For example, the intermediate encapsulation film 53 may include fewer impurities than the lower encapsulation film 51.

In this way, the lower encapsulation film 51 is first formed on one surface of the photoelectric device 10 under no strong condition such as a relatively low temperature and thus may prevent degradation of the active layer 30 in a subsequent process, and simultaneously, an intermediate encapsulation film 53 is formed without a temperature limit in the subsequent process and may effectively block or decrease an inflow of moisture and oxygen from outside. Accordingly, degradation of the active layer 30 may be prevented in the subsequent process, and simultaneously, encapsulation performance of the electronic device may be enhanced.

The lower encapsulation film 51 may have for example a thickness of about 2 nm to about 30 nm.

The intermediate encapsulation film 53 may be for example thicker than the lower encapsulation film 51, and may have for example a thickness of about 10 nm to about 200 nm.

The lower encapsulation film 51 and the intermediate encapsulation film 53 may be etched with the same pattern as the opposed electrode 40 and thereby the lower encapsulation film 51, the intermediate encapsulation film 53, and the opposed electrode 40 may have the substantially same planar shape.

The upper encapsulation film 52 is the same as above and may cover upper and side surfaces of the lower encapsulation film 51, the intermediate encapsulation film 53, and the photoelectric device 10. The upper encapsulation film 52 may include for example an inorganic material, an organic material, organic/inorganic material or combination thereof, for example an oxide, a nitride, an oxynitride, an organic material, or an organic/inorganic composite, for example an oxide, a nitride, or an oxynitride including at least one of aluminum, titanium, zirconium, hafnium, tantalum, and silicon, but is not limited thereto.

Hereinafter, referring to FIGS. 10 to 14, methods of manufacturing electronic devices of FIGS. 8 and 9 are for example described.

FIG. 10, FIG. 11, FIG. 12, FIG. 13, and FIG. 14 are cross-sectional views sequentially showing methods of manufacturing electronic devices of FIG. 8 and FIG. 9.

Figure 10:
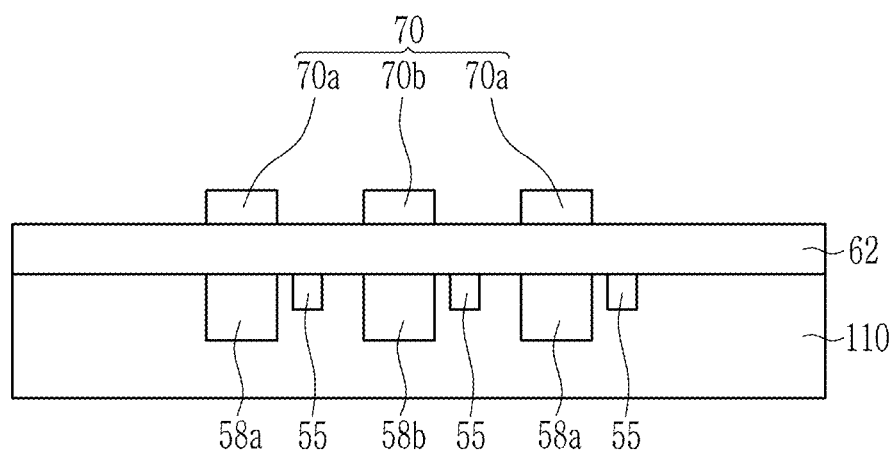
FIG. 10, FIG. 11, FIG. 12, FIG. 13, and FIG. 14 are cross-sectional views sequentially showing methods of manufacturing electronic devices of FIG. 8 and FIG. 9.

First, referring to FIG. 10, a substrate 110 integrated with photo-sensing devices 58a and 58b, a transmission transistor (not shown), and a charge storage 55 is prepared. The substrate 110 may be for example a semiconductor substrate, for example a silicon wafer.

Subsequently, a lower insulation layer 62 and a color filter layer 70 are sequentially formed on the substrate 110.

Figure 11:
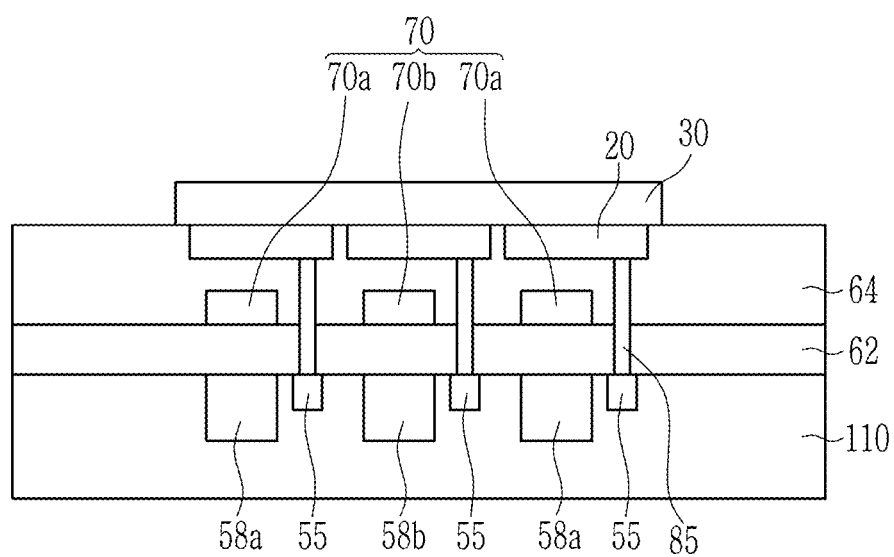

Then, referring to FIG. 11, an upper insulation layer 64 is formed on the color filter layer 70 and a plurality of trenches 85 penetrating the upper insulation layer 64 and the lower insulation layer 62 are formed. The trenches 85 may be filled with fillers.

Subsequently, still referring to FIG. 11, a plurality of pixel electrodes 20s are formed on the upper insulation layer 64. The pixel electrode 20 may be for example made of a transparent conductor such as indium tin oxide (ITO) or indium zinc oxide (IZO) or a metal thin film of a monolayer or a plural layer and may be for example formed by sputtering.

Subsequently, still referring to FIG. 11, an active layer 30 is formed on a plurality of pixel electrodes 20. The active layer 30 may be deposited on an entire surface of the active region and may be for example by thermal deposition or chemical vapor deposition (CVD), for example thermal deposition or chemical vapor deposition (CVD) using a shadow mask.

Figure 12:
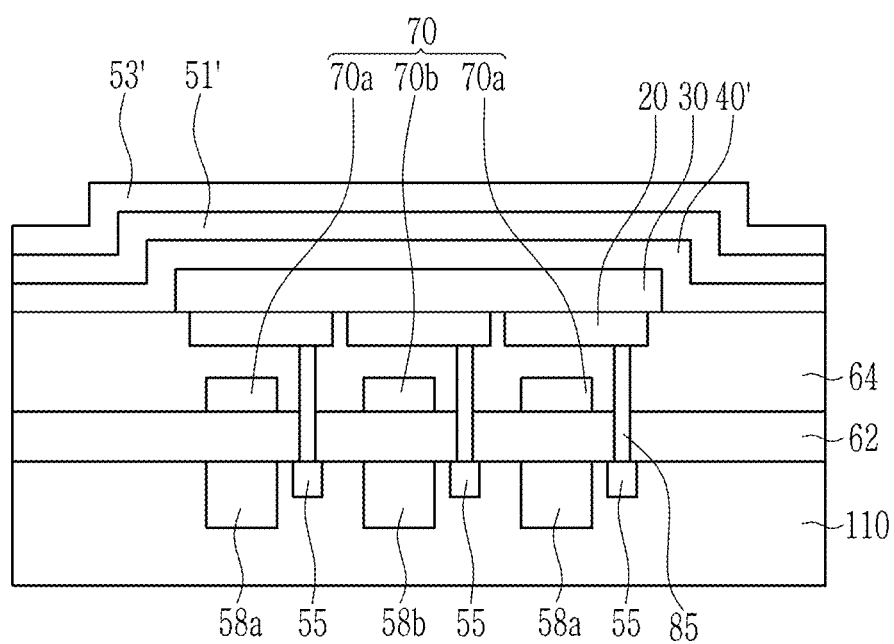

Next, referring to FIG. 12, the conductive layer 40' for the opposed electrode ("associated with the opposed electrode") is formed on the active layer 30. The conductive layer 40' for the opposed electrode may be made of ("may at least partially comprise") a transparent conductor such as indium tin oxide (ITO) or indium zinc oxide (IZO), or a metal thin film of a monolayer or a plural layer. The conductive layer 40' for the opposed electrode may be for example formed by thermal deposition, chemical vapor deposition (CVD), atomic layer deposition, or sputtering, and may be formed on entire surfaces of the active layer 30 and the upper insulation layer 64 without using a separate shadow mask.

Subsequently, still referring to FIG. 12, a thin film 51' for the lower encapsulation film and a thin film 53' for an intermediate encapsulation film ("associated with an intermediate encapsulation film") are sequentially formed on the conductive layer 40' for the opposed electrode. The thin film 51' for the lower encapsulation film and the thin film 53' for the intermediate encapsulation film may be for example formed by thermal deposition, chemical vapor deposition (CVD), atomic layer deposition, or sputtering, and may be formed on entire surfaces of the conductive layer 40' for the opposed electrode without using a separate shadow mask.

For example, the thin film 51' for the lower encapsulation film and the thin film 53' for the intermediate encapsulation film may be formed of the same material ("a common material") or a different material.

For example, the thin film 51' for the lower encapsulation film and the thin film 53' for the intermediate encapsulation film may be formed of the same material. For example, the thin film 51' for the lower encapsulation film and the thin film 53' for the intermediate encapsulation film may be formed of the same material by a different process. For example, the thin film 51' for the lower encapsulation film and the thin film 53' for the intermediate encapsulation film may be for example formed by depositing an oxide, a nitride, or an oxynitride including at least one of aluminum (Al), titanium (Ti), zirconium (Zr), hafnium (Hf), tantalum (Ta), and silicon(Si) at a different temperature from each other. For example, the thin film 51' for the lower encapsulation film may be deposited at about 110° C. or less, for example a temperature of about 50° C. to about 110° C. The thin film 51' for the lower encapsulation film may be for example formed by an atomic layer deposition method or a chemical vapor deposition (CVD) method within the temperature ranges, but is not limited thereto. The thin film 53' for the intermediate encapsulation film may be deposited at a higher temperature than the thin film 51' for the lower encapsulation film, and may be for example deposited at about 220° C. or less. The thin film 53' for the intermediate encapsulation film may be deposited at a temperature of about 80° C. to about 220° C., for example about 100° C. to about 200° C. The thin film 53' for the intermediate encapsulation film may be for example formed by an atomic layer deposition method or a chemical vapor deposition (CVD) method, but is not limited thereto.

For example, the thin film 51' for the lower encapsulation film and the thin film 53' for the intermediate encapsulation film may be formed a different material. For example, the thin film 51' for the lower encapsulation film may include an oxide, a nitride, or an oxynitride including at least one of aluminum, titanium, zirconium, hafnium, and tantalum and the thin film 53' for the intermediate encapsulation film may include an oxide, a nitride, or an oxynitride including silicon. For example, the thin film 51' for the lower encapsulation film may include aluminum oxide and the thin film 53' for the intermediate encapsulation film may include $SiO_2$, $SiN_x$ ($1 \leq x \leq 2$), or SiON.

Figure 13:
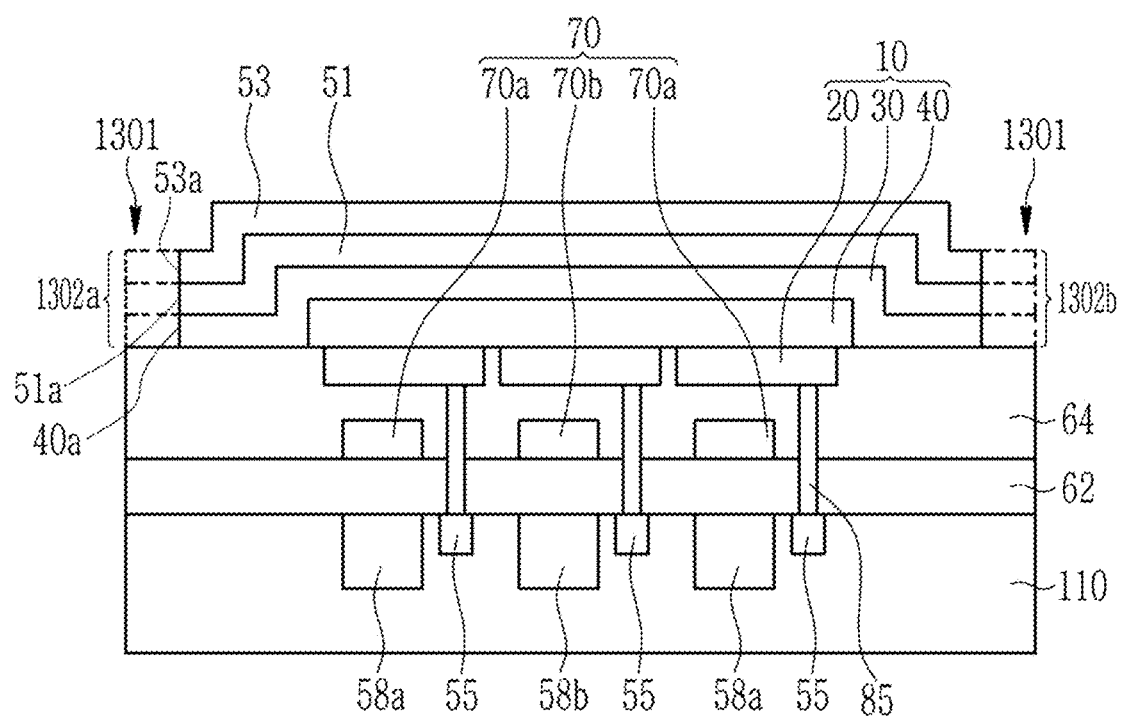

Next, referring to FIG. 13, the conductive layer 40' for the opposed electrode, the thin film 51' for the lower encapsulation film and the thin film 53' for the intermediate encapsulation film are simultaneously or sequentially etched. The etching 1301 may be for example photolithography and/or dry etching, but is not particularly limited.

The etching may be based on and/or may be, for example, photolithography and/or dry etching, but is not particularly limited. The etching may be performed by various methods. For example, the thin film 53' for the intermediate encapsulation film, the thin film 51' for the lower encapsulation film, and the conductive layer 40' for the opposed electrode may be simultaneously etched using one etching mask. For example, the thin film 53' for the intermediate encapsulation film is etched using an etching mask to form an intermediate encapsulation film 53, and then the thin film 51' for the lower encapsulation film and the conductive layer 40' for the opposed electrode are etched using the intermediate encapsulation film 53 as a mask to form a lower encapsulation film 51 and an opposed electrode 40. For example, the thin film 53' for the intermediate encapsulation film and the thin film 51' for the lower encapsulation film are etched using an etching mask to form an intermediate encapsulation film 53 and a lower encapsulation film 51 and then the conductive layer 40' for the opposed electrode is etched to form an opposed electrode 40 using the intermediate encapsulation film 53 and the lower encapsulation film 51 as a mask. As shown in FIG. 13, performing the etching 1301 to form the opposed electrode 40, the lower encapsulation film 51, and the intermediate encapsulation film 53 having the substantially same planar shape (e.g., a "C" shape as shown in FIG. 13) may include removing stacked edge portions 1302a and 1302b of the conductive layer 40', thin film 51', and thin film 53' such that only central respective portions thereof remain on the upper insulation layer 64 to form the opposed electrode 40, the lower encapsulation film 51, and the intermediate encapsulation film 53, wherein the outer sidewalls 40a of the opposed electrode 40, the outer sidewalls 51a of the lower encapsulation film, and the outer sidewalls 53a of the intermediate encapsulation film 53, formed by the etching 1301, are coplanar or substantially coplanar (e.g., coplanar within manufacturing tolerances and/or material tolerances).

By such methods, the conductive layer 40' for the opposed electrode, the thin film 51' for the lower encapsulation film, and the thin film 53' for the intermediate encapsulation film are etched together to form the opposed electrode 40, the lower encapsulation film 51, and the intermediate encapsulation film 53 having the substantially same planar shape.

Figure 14:
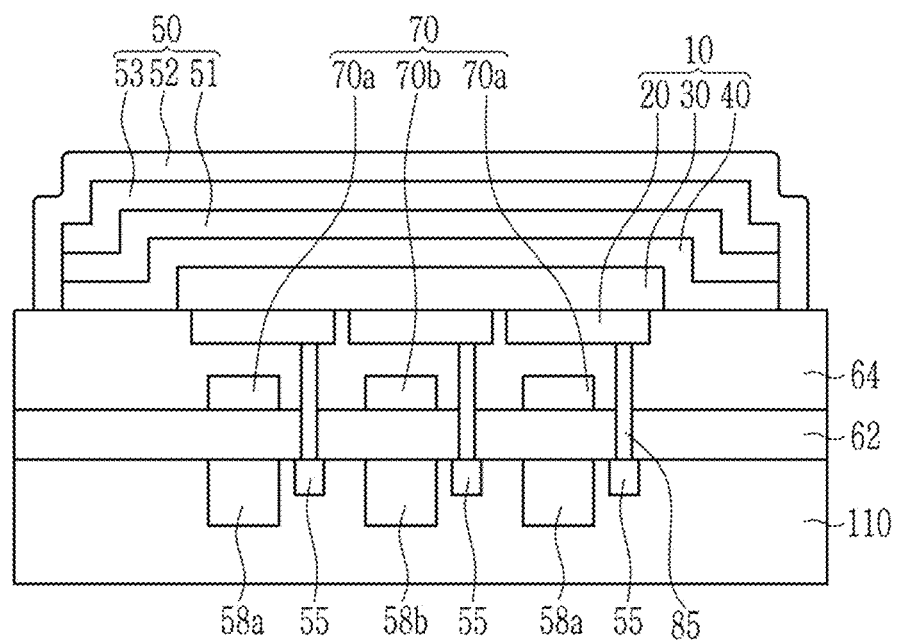

Next, referring to FIG. 14, the thin film 52' for the upper encapsulation film ("associated with the upper encapsulation film") is formed on the intermediate encapsulation film 52 and is patterned to form an upper encapsulation film 52. The thin film 52' for the upper encapsulation film may include for example an oxide, a nitride, an oxynitride, an organic material, or an organic/inorganic composite. The thin film 52' for the upper encapsulation film may be for example formed by thermal deposition or chemical vapor deposition (CVD) and is not particularly limited thereto. The upper encapsulation film 52 may be formed to cover upper and side surfaces of the intermediate encapsulation film 53, the lower encapsulation film 51, and the opposed electrode 40.

Next, referring to FIG. 9, a focusing lens 90 is formed on the upper encapsulation film 52.

As described above, an electronic device according to some example embodiments is configured to effectively protect the active layer by forming the opposed electrode 40 without using a shadow mask and simultaneously or sequentially etching the opposed electrode 40, the lower encapsulation film 51, and the intermediate encapsulation film 53, and thereby performance degradation of the electronic device may be prevented.

A conventional method of forming the active layer 30 and the opposed electrode 40 by using a shadow mask may deteriorate performance of the active layer 30 due to an electrode material attached on shadow mask due to its repetitive use and deposited along as a particle during formation of the active layer 30. In addition, uniformity of center and edge parts of a pattern may be reduced by a shadow effect according to use of the shadow mask, and thus performance of an electronic device may be deteriorated.

In some example embodiments, the active layer 30 and the opposed electrode 40 may be separately formed and thus prevent performance degradation of the active layer 30 and the electronic device according to use of the shadow mask and simultaneously, freely determined to have each size and area and thus effectively disposed in a limited space. In addition, the conductive layer 40' for the opposed electrode may be formed to entirely cover upper and side surfaces of the active layer 30 and thus may prevent a direct exposure of the active layer 30 to heat, light, and/or a chemical liquid in a subsequent process.

Furthermore, the opposed electrode 40 and the lower encapsulation film 51 may be simultaneously or sequentially etched to form a satisfactory pattern without an additional process.

In addition, encapsulation performance may be further improved by forming the lower encapsulation film 51 and the intermediate encapsulation film 52.

An image sensor is illustrated above as one example of the electronic device, but the electronic device is not limited thereto but may be for example any electronic device having a structure including an electrode, an active layer, and an encapsulation film. For example, the electronic device may be a photoelectric device, an organic light emitting diode, a solar cell, a photosensor, and the like, but is not limited thereto.

The electronic device may be various electronic apparatuses, for example a mobile phone, a digital camera, a solar cell, an organic light emitting diode (OLED) display, and the like, but is not limited thereto.

Hereinafter, the embodiments are illustrated in more detail with reference to examples. However, these embodiments are examples, and the present disclosure is not limited thereto.

Example 1

A 150 nm-thick pixel electrode is formed by sputtering ITO on a substrate. Subsequently, a 5 nm-thick charge auxiliary layer is formed by disposing a shadow mask on a pixel electrode and depositing a compound represented by Chemical Formula A, and a 130 nm-thick active layer is formed by codepositing a compound represented by Chemical Formula B as a p-type semiconductor and C60 as an n-type semiconductor in a volume ratio of 1:1. Then, a 7 nm-thick conductive layer for an opposed electrode is formed by removing the shadow mask and depositing ITO on the active layer and the substrate. On the conductive layer for an opposed electrode, a 30 nm-thick thin film for a lower encapsulation film is formed by atomic layer-depositing aluminum oxide. Subsequently, an opposed electrode and a lower encapsulation film having a common planar shape are formed by disposing an etching mask on the thin film for a lower encapsulation film and sequentially dry-etching the thin film for a lower encapsulation film and the conductive layer. The dry etching is performed under a condition such as power of 250 W, vacuum of 75 mtorr, used gas and its gas flow rate of $BCl_3:Cl_2:Ar=65:25:15$ sccm, and etching time of 850 seconds. Subsequently, a 145 nm-thick upper protective layer is formed by depositing silicon oxynitride (SiON) on the lower encapsulation film at 160° C. to manufacture an electronic device.

[Chemical Formula A]

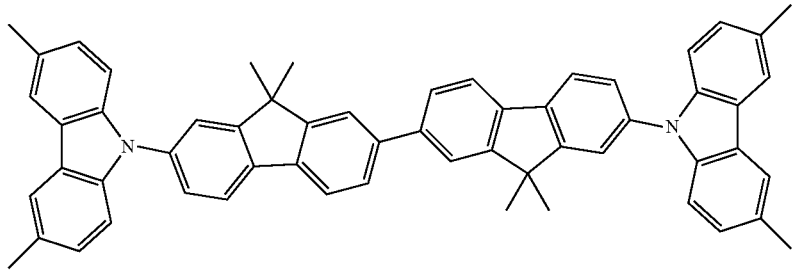

[Chemical Formula B]

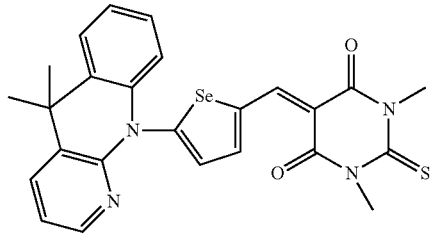

Example 2

A 150 nm-thick pixel electrode is formed by sputtering ITO on a substrate. Subsequently, a 5 nm-thick charge auxiliary layer is formed by disposing a shadow mask on the pixel electrode and depositing a compound represented by Chemical Formula A, and a 130 nm-thick active layer is formed by codepositing a compound represented by Chemical Formula B as a p-type semiconductor and C60 as an n-type semiconductor in a volume ratio of 1:1. Then, a 7 nm-thick conductive layer for an opposed electrode is formed by removing shadow mask and the depositing ITO on the active layer and the substrate. On the conductive layer for an opposed electrode, a 30 nm-thick lower encapsulation film is formed by atomic layer-depositing aluminum oxide, and a 145 nm-thick thin film for an intermediate encapsulation film is formed by depositing silicon oxynitride (SiON) at 160° C. Subsequently, an opposed electrode, a lower encapsulation film, and an intermediate encapsulation film having a common planar shape are formed by disposing an etching mask on the thin film for an intermediate encapsulation film and sequentially dry-etching the thin film for an intermediate encapsulation film, the thin film for a lower encapsulation film, and the conductive layer for an opposed electrode. The dry etching of the thin film for an intermediate encapsulation film is performed under a condition such as power of 250 W, vacuum of 80 mtorr, used gas of CF4 and a gas flow rate of 80 sccm, and etching time of 220 seconds, and the dry etching of the thin film for a lower encapsulation film and the conductive layer for an opposed electrode is performed under a condition such as a power of 250 W, a vacuum of 75 mtorr, used gases and gas flow rates of $BCl_3:Cl_2:Ar=65:25:15$ sccm, and an etching time of 850 seconds. Subsequently, a 145 nm-thick upper protective layer is formed on the intermediate encapsulation film by depositing silicon oxynitride (SiON) at 160° C. in order to manufacture an electronic device.

Comparative Example 1

A 150 nm-thick pixel electrode is formed by sputtering ITO on a substrate. Subsequently, a charge auxiliary layer is formed by disposing a shadow mask on the pixel electrode and depositing a compound represented by Chemical Formula A, and a 130 nm-thick active layer is formed by codepositing a compound represented by Chemical Formula B as a p-type semiconductor and C60 as an n-type semiconductor in a volume ratio of 1:1, and a 7 nm-thick opposed electrode is formed by depositing ITO.

Subsequently, A 30 nm-thick thin film for a lower encapsulation film is formed by atomic layer-depositing aluminum oxide on the opposed electrode, and a 145 nm-thick thin film for an intermediate encapsulation film is formed by depositing silicon oxynitride (SiON) at 160° C. Subsequently, a lower encapsulation film and an intermediate encapsulation film are formed by disposing an etching mask on the thin film for an intermediate encapsulation film and sequentially dry-etching the thin film for an intermediate encapsulation film and the thin film for a lower encapsulation film. The dry etching of the thin film for an intermediate encapsulation film is performed under a condition such as a power of 250 W, a vacuum of 80 mtorr, used gases of CF4 and gas flow rates of 80 sccm, and an etching time of 220 seconds, and the dry etching of the thin film for a lower encapsulation film is performed under a condition such as a powder of 250 W, a vacuum of 75 mtorr, used gases and gas flow rates of $BCl_3:Cl_2:Ar=65:25:15$ sccm, and an etching time of 850 seconds. Subsequently, a 145 nm-thick upper protective layer is formed on the intermediate encapsulation film by depositing silicon oxynitride (SiON) at 160° C. to manufacture an electronic device.

Evaluation

Evaluation 1

A contamination degree of each active layer in the electronic devices according to Example 1 and Comparative Example 1 is evaluated.

The contamination degree of the active layers is evaluated by using AIT UV™ (KLA-TENCOR Corporation) in a particle counter method.

Figure 15:
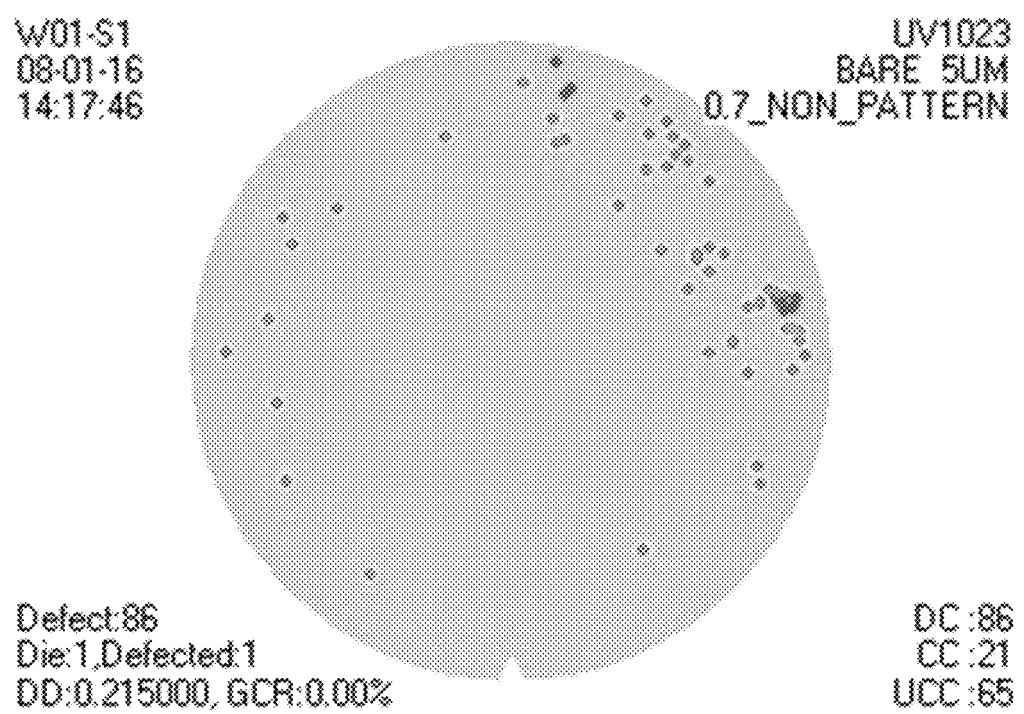
FIG. 15 is a photograph showing a particle distribution of an active layer in the electronic device of Example 1.
Figure 16:
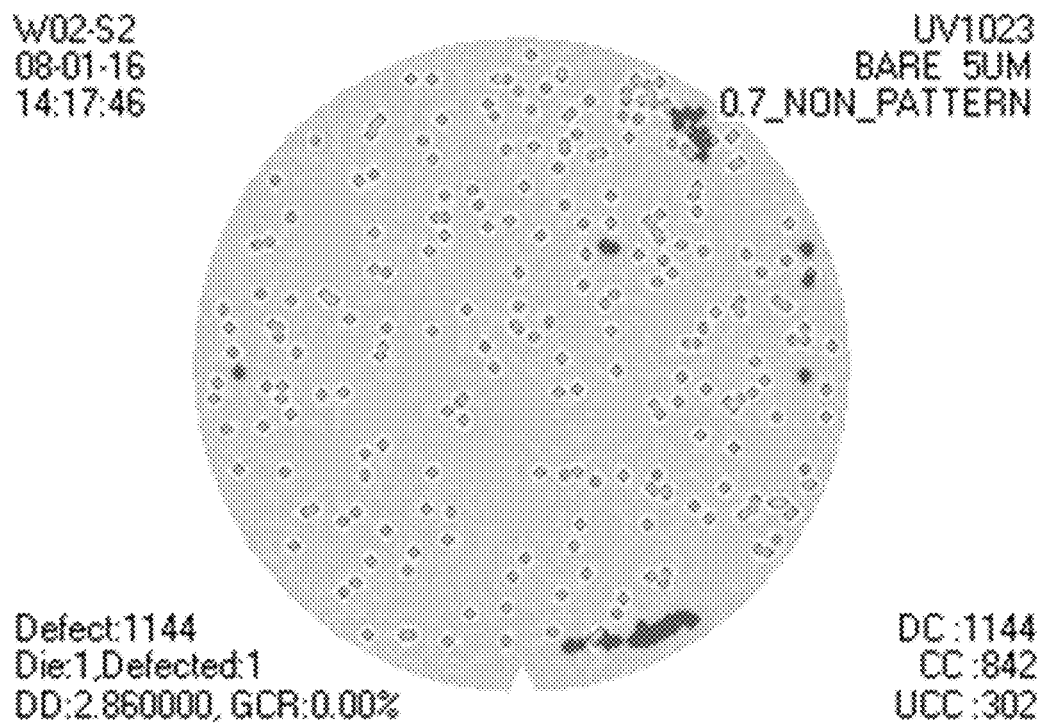
FIG. 16 is a photograph showing a particle distribution of an active layer in the electronic device of Comparative Example 1.

The results are shown in FIGS. 15 and 16.

FIG. 15 is a photograph showing a particle distribution of the active layer of the electronic device of Example 1 and FIG. 16 is a photograph showing a particle distribution of the active layer of the electronic device of Comparative Example 1.

Referring to FIGS. 15 and 16, the electronic device of Example 1 using no shadow mask during manufacture of an opposed electrode showed the remarkably reduced number of particles compared with the electronic device of Comparative Example 1 using a shadow mask during manufacture of an opposed electrode. Herein, since a particle having a relatively large size of greater than or equal to about 1 µm is examined, about 86 particles per unit area are found in the electronic device of Example 1, while about 1144 particles per unit area are found in the electronic device of Comparative Example 1. Accordingly, the electronic device using no shadow mask and instead includes an opposed electrode and a lower encapsulation film having a common planar shape according to Example 1 showed sharply decreased contamination degrees of an active layer, and thus improved performance of the electronic device of Example 1 and/or improved performance of an electronic apparatus including the electronic device of Example 1, compared with the electronic device using a shadow mask according to Comparative Example 1.

Evaluation 2

External quantum efficiency (EQE) and a leakage current of the electronic devices of Examples 1 and 2 and Comparative Example 1 are evaluated.

The external quantum efficiency (EQE) is evaluated at 3 V in a wavelength spectrum of light ($\lambda_{max}$=550 nm) of 400 nm to 720 nm in an Incident Photon to Current Efficiency (IPCE) method.

The leakage current is evaluated from dark current density, and the dark current density may be measured from a current when a reverse bias of −3 V is applied.

The results are shown in Table 1.

TABLE 1

| | $EQE_{550\,nm}$ (%) | Dark current density (h/s/µm²) |
|---|---|---|
| Example 1 | 64.6 | 1 |
| Example 2 | 64.7 | 1 |
| Comparative Example 1 | 64.1 | 5 |

Referring to Table 1, the electronic devices of Examples 1 and 2 show equivalent external quantum efficiency to the electronic device of Comparative Example 1 but a largely reduced leakage current of about ⅕ compared with the electronic device of Comparative Example 1. Accordingly, the electronic devices of Examples 1 and 2 are expected to show ("exhibit") a much decreased leakage current due to much decreased contamination degree of an active layer. As a result, the electronic devices of Examples 1 and 2 are expected to show ("exhibit") a much improved performance and thus functionality.

Figure 17:
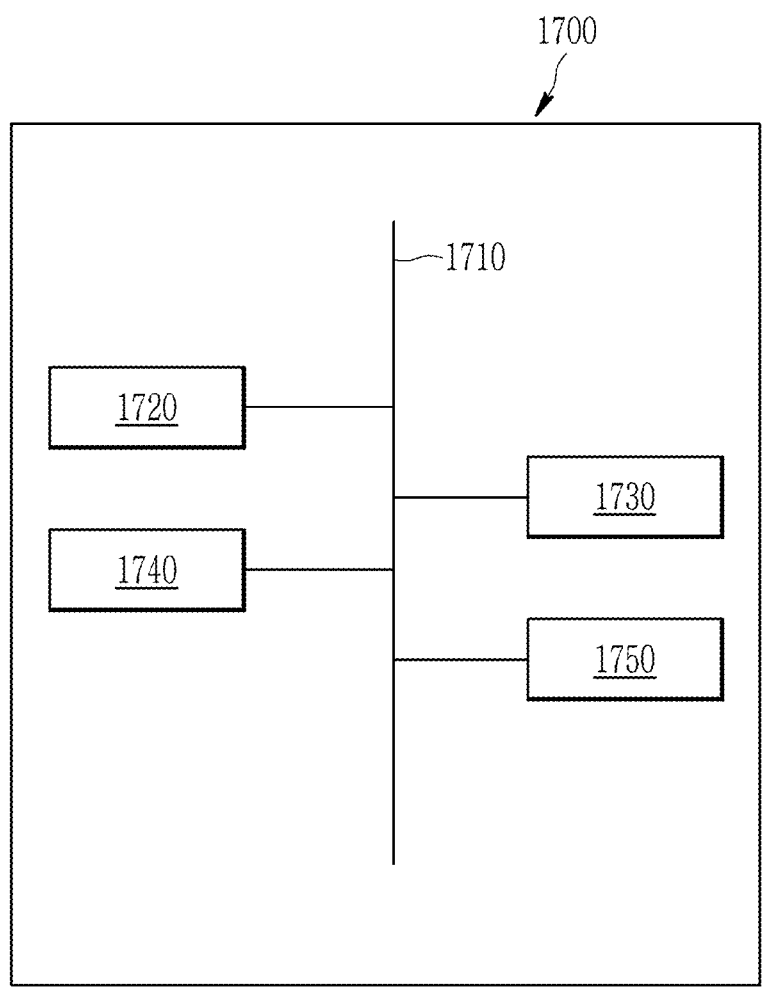
FIG. 17 is a diagram illustrating an electronic device according to some example embodiments.

FIG. 17 is a diagram illustrating an electronic device 1700 according to some example embodiments.

Referring to FIG. 17, the electronic device 1700 includes a memory 1720, a processor 1730, a device 1740, and a communication interface 1750. The device 1740 may include any of the electronic devices illustrated and described herein.

The electronic device 1700 may be included in one or more various electronic devices, including, for example, a mobile phone, a digital camera, a sensor device, a biosensor device, and the like. In some example embodiments, the electronic device 1700 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 1720, the processor 1730, the device 1740, and the communication interface 1750 may communicate with one another through a bus 1710.

The communication interface 1750 may communicate data from an external device using various Internet protocols. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 1730 may execute a program and control the electronic device 1700. A program code to be executed by the processor 1730 may be stored in the memory 1720. An electronic system may be connected to an external device through an input/output device (not shown) and exchange data with the external device.

The memory 1720 may store information. The memory 1720 may be a volatile or a nonvolatile memory. The memory 1720 may be a non-transitory computer readable storage medium. The memory may store computer-readable instructions that, when executed, cause the execution of one or more methods, functions, processes, etc. as described herein. In some example embodiments, the processor 1730 may execute one or more of the computer-readable instructions stored at the memory 1720.

In some example embodiments, the communication interface 1750 may include a USB and/or HDMI interface. In some example embodiments, the communication interface 1750 may include a wireless communication interface.

Figure 18:
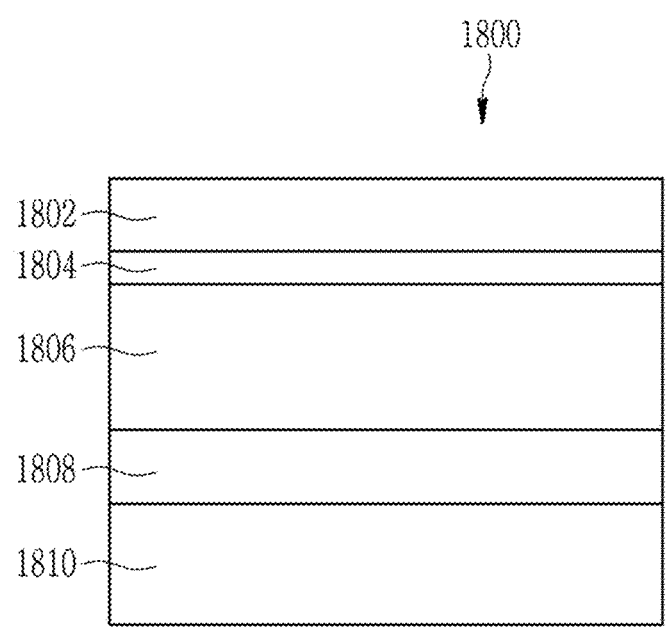
FIG. 18 is a cross-sectional view showing a solar cell according to some example embodiments.

FIG. 18 is a cross-sectional view showing a solar cell 1800 according to some example embodiments. Referring to FIG. 18, a solar cell 1800 includes a first electrode 1802 and a second electrode 1810, and a photoactive layer 1806 positioned between the first electrode 1802 and the second electrode 1810.

A substrate (not shown) may be positioned at the first electrode 1802 or the second electrode 1810, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 1802 and the second electrode 1810 is an anode and the other is a cathode. At least one of the first electrode 1802 and second electrode 1810 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 1802 and the second electrode 1810 may be an opaque electrode, which may be made of an opaque conductor, for example, aluminum (Al), silver (Ag), gold (Au), and/or lithium (Li).

The photoactive layer 1806 may include an electronic device according to some example embodiments as described herein.

First and second auxiliary layers 1804 and 1808 may be positioned between the first electrode 1802 and the photoactive layer 1806 and between the second electrode 1810 and the photoactive layer 1806, respectively. The first and second auxiliary layers 1804 and 1808 may increase charge mobility between the first electrode 1802 and the photoactive layer 1806 and between the second electrode 1810 and the photoactive layer 1806. The first and second auxiliary layers 1804 and 1806 may be at least one selected from, for example, an electron injection layer (EIL), an electron transport layer, a hole injection layer (HIL), a hole transport layer, and a hole blocking layer, but are not limited thereto. One or both of the first and second auxiliary layers 1804 and 1808 may be omitted.

The photoactive layer 1806 may have a tandem structure where at least two thereof are stacked.

Figure 19:
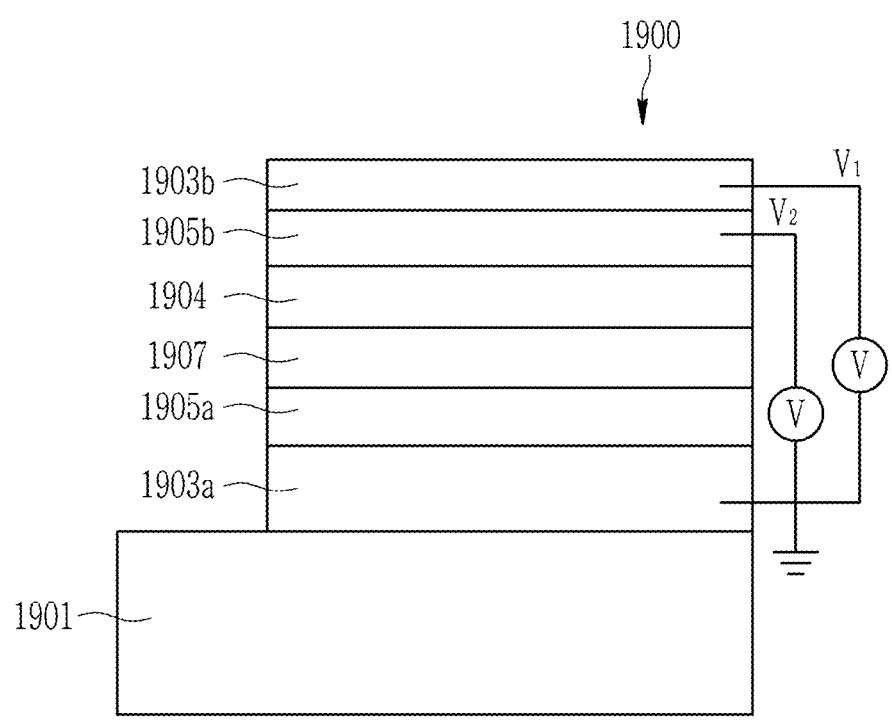
FIG. 19 is a sectional view of an organic light-emitting display apparatus according to some example embodiments.

FIG. 19 is a sectional view of an organic light-emitting display apparatus 1900 according to some example embodiments.

Referring to FIG. 19, a first electrode 1903a and a second electrode 1903b are positioned on a substrate 1901, a first emission layer 1905a is positioned on the first electrode 1903a, and a second emission layer 1905b is positioned under the second electrode 1903b.

The substrate 1901 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 1903a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1903a may have a thickness of about 190 to about 190 nm.

The second electrode 1903b may include a material having a work function of about 19.3 eV to about 19.7 eV or about 19.5 eV to about 19.7 eV. According to some example embodiments, the second electrode 1903b may include Ba:Al. The second electrode 1903*b* may have a thickness of about 190 to about 190 nm.

The first emission layer 1905*a* and the second emission layer 1905*b* may include an electronic device according to some example embodiments as described herein.

A middle electrode 1904 is positioned between the first emission layer 1905*a* and the second emission layer 1905*b*. The middle electrode 1904 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1907 may be positioned between the first emission layer 1905*a* and the middle electrode 1904, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

Figure 20:
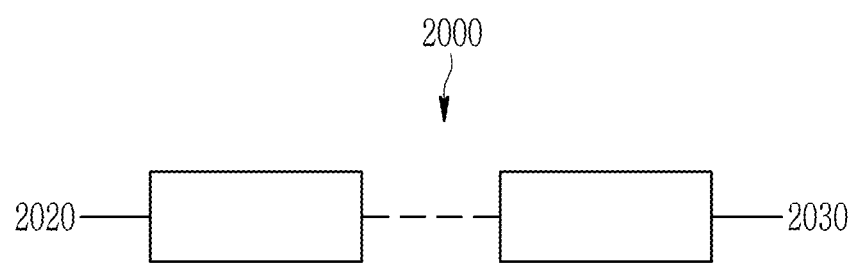
FIG. 20 is a view showing a sensor according to some example embodiments.

FIG. 20 is a view showing a sensor 2000 according to some example embodiments.

Referring to FIG. 20, a sensor 2000 (for example a gas sensor, light sensor, energy sensor, but example embodiments are not limited thereto) includes at least one electrode 2020 configured to output a signal to a processor 2030. The processor 2030 may include a microprocessor, but example embodiments are not limited thereto. The electrode 2020 may include an electronic device according to some example embodiments as described herein.

Figure 21:
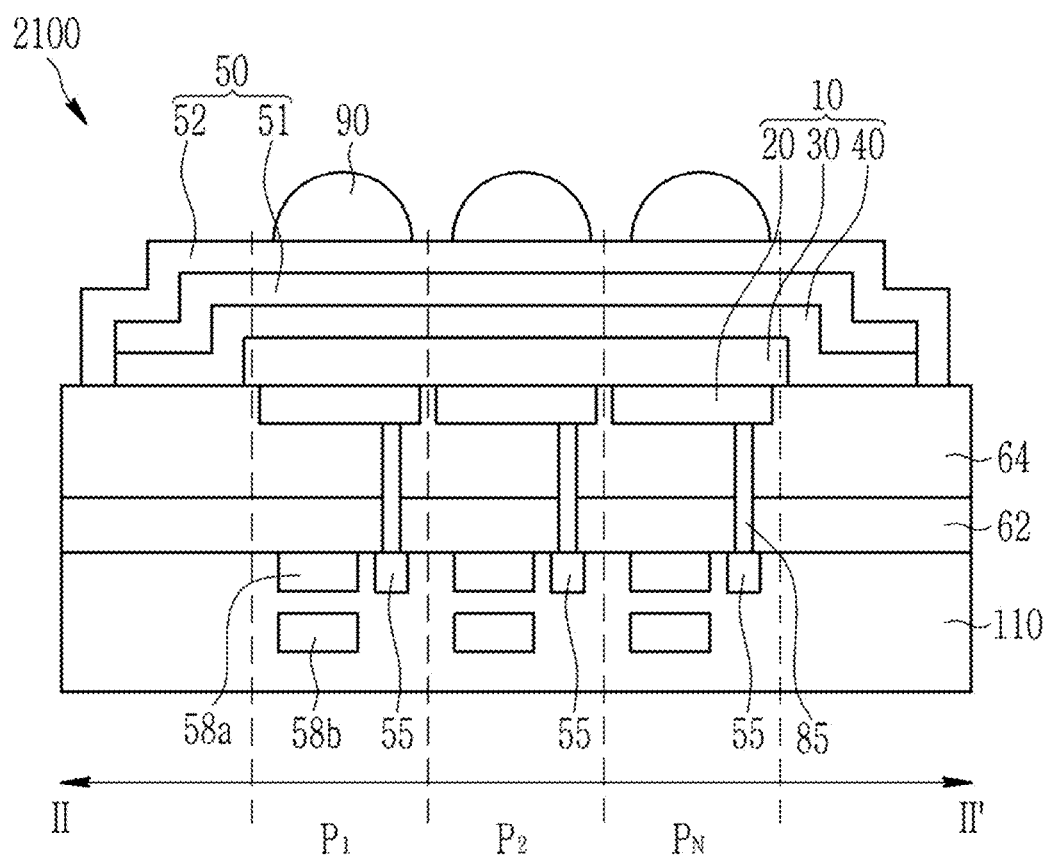
FIG. 21 is a schematic cross-sectional view showing the electronic device of FIG. 1 taken along cross-sectional view line II-II' according to some example embodiments.

FIG. 21 is a schematic cross-sectional view of the electronic device of FIG. 1 taken along a cross-sectional view line II-II' according to some example embodiments.

FIG. 21 includes elements having common reference labels as elements shown in FIG. 2; to the extent that these elements in FIG. 21 are the same as elements shown in FIG. 2, the elements are not further described in detail and the description of the elements as shown in FIG. 2 is incorporated into the description of the elements in FIG. 21.

In some example embodiments, an electronic device 2100 includes the substrate 110 in which the photo-sensing devices 58*a* and 58*b*, a transmission transistor (not shown) and charge storages 55 are integrated, at least one of a lower insulation layer 62 and an upper insulation layer 64, a photoelectric device 10, an encapsulation film 50, and a lens 90. As shown, color filter layer 70 is omitted.

In some example embodiments, as shown in FIG. 21, each pixel P1 to PN includes both the photo-sensing devices 58*a* and 58*b*, where the photo-sensing devices 58*a* and 58*b* are stacked in a vertical direction, but the color filter layer 70 is omitted. The photo-sensing devices 58*a* and 58*b* may be electrically connected to charge storage 55 and may be transferred by the transmission transistor. The photo-sensing devices 58*a* and 58*b* may selectively absorb light in separate, respective wavelength spectra of light depending on a stacking depth in the substrate 110.

As described above, the substrate 110 and the photoelectric device 10 have a stack structure and the photo-sensing devices 58*a* and 58*b* have a stack structure and thereby the size of an electronic device may be reduced to realize a down-sized electronic device 2100. In FIG. 21, the photoelectric device 10 of FIG. 2 is for example included, but it is not limited thereto.

While both the lower insulation layer 62 and the upper insulation layer 64 are shown in FIG. 21, it will be understood that, in some example embodiments of the electronic device 2100, one of the lower insulation layer 62 and the upper insulation layer 64 is omitted, such that the electronic device 2100 includes an individual insulation layer between the photoelectric device 10 and the substrate 110, the individual insulation layer being one of the lower insulation layer 62 and the upper insulation layer 64.

Figure 22:
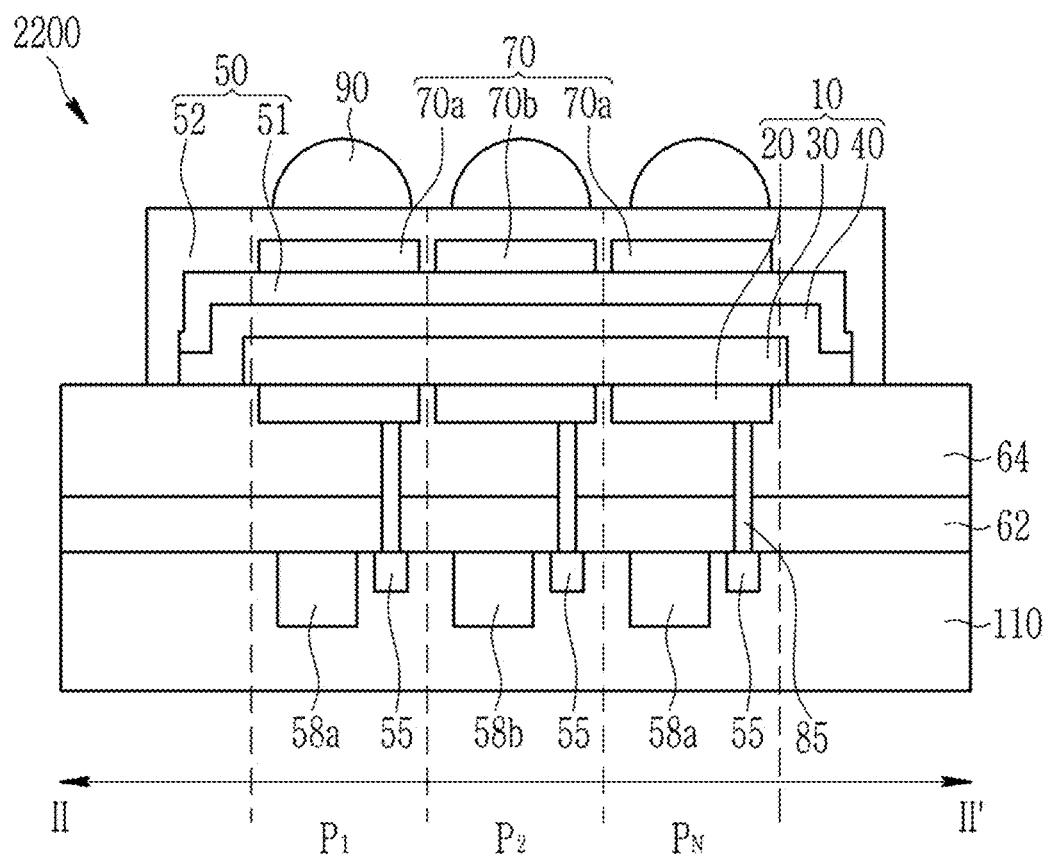
FIG. 22 is a schematic cross-sectional view showing the electronic device of FIG. 1 taken along cross-sectional view line II-II' according to some example embodiments.

FIG. 22 is a schematic cross-sectional view of the electronic device of FIG. 1 taken along a cross-sectional view line II-II' according to some example embodiments.

FIG. 22 includes elements having common reference labels as elements shown in FIG. 2; to the extent that these elements in FIG. 22 are the same as elements shown in FIG. 2, the elements are not further described in detail and the description of the elements as shown in FIG. 2 is incorporated into the description of the elements in FIG. 22.

In some example embodiments, an electronic device 2200 includes the substrate 110 in which the photo-sensing devices 58*a* and 58*b*, a transmission transistor (not shown) and charge storages 55 are integrated, at least one of a lower insulation layer 62 and an upper insulation layer 64, a photoelectric device 10, an encapsulation film 50, a color filter layer 70, and a lens 90.

In some example embodiments, as shown in FIG. 22, the color filter layer 70 may be on the photoelectric device 10 and distal from the photo-sensing devices 58*a* and 58*b*, such that the photoelectric device 10 is between the color filter layer 70 and the photo-sensing devices 58*a* and 58*b*. As shown in FIG. 22, the color filters 70*a* and 70*b* of the color filter layer 70 may be formed on an upper surface of the lower encapsulation film 51 and the upper encapsulation film 52 may be formed on the lower encapsulation film 51 and color filter layer 70, such that the upper encapsulation film 52 covers upper and side surfaces of the color filters 71 and 70*b*, in addition to covering upper and side surfaces of the lower encapsulation film 51 that are exposed by the color filter layer 70, and the upper encapsulation film 52 may further present a smooth upper surface over the color filter layer 70. In some example embodiments, the color filter layer 70 may be integrated with the upper encapsulation film 52 such that upper surfaces of the color filters 70*a* and 70*b* are co-planar or substantially co-planar with an upper surface ("top surface") of the upper encapsulation film 52.

In some example embodiments, one or more of the first color filter 70*a* and the second color filter 70*b* may be configured to selectively transmit a wavelength spectrum of mixed light of at least two colors out of three primary colors (e.g., red light, blue light, and/or green light). The mixed wavelength spectra of light selectively transmitted by each of the color filters 70*a* and 70*b* may include a wavelength spectrum of light that the photoelectric device 10 is configured to selectively absorb ("sense").

For example, in the example embodiments shown in FIG. 22, the active layer 30 may be configured to selectively absorb a first wavelength spectrum of visible light, and the color filter 70*a* may be configured to selectively pass light in a first mixed wavelength spectrum (hereinafter, referred to "first mixed light") that is different from the first visible light but includes the first wavelength spectrum of visible light, and the color filter 70*b* may be configured to selectively pass light in a second mixed wavelength spectrum (hereinafter, referred to "second mixed light") that is different from the first visible light and the first mixed light but includes the first wavelength spectrum of visible light.

The first mixed light and the second mixed light may each be a different mixed light of at least two selected from blue light, green light, and red light. For example, mixed light of blue light and green light may be cyan light, mixed light of red light and green light may be yellow light, and mixed light of red light and blue light may be magenta light, and mixed light of red light, blue light, and green light may be white light. A color filter configured to selectively transmit mixed light may thus be configured to selectively transmit one light (wavelength spectrum of light) of cyan light, yellow light, magenta light, or white light.

For example, in the example embodiments shown in FIG. 22, if and/or when the active layer 30 is configured to selectively absorb ("sense") green light, the color filter 70a may be a cyan filter that is configured to selectively transmit cyan light (a first mixed light of blue light and green light) and the color filter 70b may be a yellow filter that is configured to selectively transmit yellow light (a second, different mixed light of red light and green light). Photo-sensing device 58a may sense the blue light that passes from color filter 70a and through the photoelectric device 10 while the green light passing from the color filter 70a is absorbed by the active layer 30 of the photoelectric device 10. Photo-sensing device 58b may sense the red light that passes from color filter 70b and through the photoelectric device 10 while the green light passing from the color filter 70b is absorbed by the active layer 30 of the photoelectric device 10.

In some example embodiments, including the example embodiments shown in FIG. 22, adjacent color filters 70a and 70b in adjacent pixels may be configured to selectively transmit different wavelength spectra of mixed light. In some example embodiments, including the example embodiments shown in FIG. 22, adjacent photo-sensing devices 58a and 58b in adjacent pixels may be configured to sense different wavelength spectra of light. For example, color filter 70a may be a cyan filter (i.e., configured to selectively transmit cyan light) and color filter 70b may be a yellow filter (i.e., configured to selectively transmit yellow light), while photo-sensing device 58a may be a blue photo-sensing device (i.e., configured to sense blue light) and photo-sensing device 58b may be a red photo-sensing device (i.e., configured to sense red light). Thus, if and/or when the active layer 30 is configured to selectively absorb light in one wavelength spectrum of light (e.g., green light), adjacent color filters 70a and 70b of the color filter layer 70 may be configured to selectively transmit different wavelength spectra of mixed light of a plurality of wavelength spectra of mixed light, the different wavelength spectra of mixed light including both the one wavelength spectrum of light (e.g., green light) and different additional wavelength spectra of light, respectively (e.g., blue or red light).

While both the lower insulation layer 62 and the upper insulation layer 64 are shown in FIG. 22, it will be understood that, in some example embodiments of the electronic device 2200, one of the lower insulation layer 62 and the upper insulation layer 64 is omitted, such that the electronic device 2200 includes an individual insulation layer between the photoelectric device 10 and the substrate 110, the individual insulation layer being one of the lower insulation layer 62 and the upper insulation layer 64.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An electronic device, comprising:
a plurality of pixel electrodes;
an active layer on the plurality of pixel electrodes;
an opposed electrode on the active layer;
a first encapsulation film on the opposed electrode; and
a second encapsulation film on the first encapsulation film,
wherein the opposed electrode and the first encapsulation film have a common planar shape, such that the first encapsulation film covers an upper surface of the opposed electrode and exposes an outer sidewall of the opposed electrode, such that the outer sidewall of the first encapsulation film and the outer sidewall of the opposed electrode are substantially coplanar,
wherein the second encapsulation film covers an upper surface of the first encapsulation film, covers entire side surfaces of the opposed electrode and the first encapsulation film, and covers the exposed and substantially coplanar outer sidewalls of the first encapsulation film and the opposed electrode,
wherein the active layer has a shape that is different from the common planar shape of the opposed electrode and the first encapsulation film, and the opposed electrode on the active layer covers an entirety of an upper surface of the active layer and an entirety of outer sidewalls of the active layer.

2. The electronic device of claim 1, wherein a vertical area of the opposed electrode is larger than a vertical area of the active layer.

3. The electronic device of claim 2, wherein a distance between one edge of the opposed electrode and one edge of the active layer is about 1 µm to about 100 µm.

4. The electronic device of claim 2, wherein the opposed electrode covers the upper surface of the active layer and a plurality of side surfaces of the active layer.

5. The electronic device of claim 1, wherein the first encapsulation film includes a material that is one material of an oxide, a nitride, or an oxynitride.

6. The electronic device of claim 5, wherein the material includes at least one element of aluminum, titanium, zirconium, hafnium, tantalum, and silicon.

7. The electronic device of claim 1, wherein the first encapsulation film has a thickness of about 2 nm to about 30 nm.

8. The electronic device of claim 1, wherein the second encapsulation film includes a common material in relation to the first encapsulation film.

9. The electronic device of claim 8, wherein the second encapsulation film has a different film quality in relation to a film quality of the first encapsulation film.

10. The electronic device of claim 9, wherein the second encapsulation film has a greater film density than a film density of the first encapsulation film.

11. The electronic device of claim 1, wherein the second encapsulation film includes a different material from a material of the first encapsulation film.

12. The electronic device of claim 11, wherein
the first encapsulation film includes one material of an oxide, a nitride, or an oxynitride, the one material included in the first encapsulation film including at least one element of aluminum, titanium, zirconium, hafnium, and tantalum, and the second encapsulation film including one material of an oxide, a nitride, or an oxynitride, the one material included in the second encapsulation film including silicon.

13. The electronic device of claim 1, wherein the second encapsulation film is thicker than the first encapsulation film, and the second encapsulation film has a thickness of about 10 nm to about 200 nm.

14. The electronic device of claim 1, further comprising a third encapsulation film covering the second encapsulation film.

15. The electronic device of claim 14, wherein the third encapsulation film includes one material of an oxide, a nitride, an oxynitride, an organic material, or an organic/inorganic composite.

16. The electronic device of claim 1, wherein the active layer is a light-absorbing layer that is configured to selectively absorb light in one wavelength spectrum of light of a red wavelength spectrum of light, a green wavelength spectrum of light, and a blue wavelength spectrum of light.

17. The electronic device of claim 1, further comprising:
a semiconductor substrate under the plurality of pixel electrodes,
wherein the semiconductor substrate includes a plurality of photo-sensing devices vertically overlapping with the plurality of pixel electrodes.

18. The electronic device of claim 17, further comprising a color filter layer between the plurality of pixel electrodes and the semiconductor substrate.

19. A method of manufacturing an electronic device, the method comprising:
forming a pixel electrode;
forming an active layer on the pixel electrode;
forming a conductive layer associated with an opposed electrode on the active layer;
forming a thin film associated with a first encapsulation film on the conductive layer associated with the opposed electrode; and
simultaneously or sequentially etching the thin film associated with the first encapsulation film and the conductive layer associated with the opposed electrode to form the first encapsulation film and the opposed electrode, such that
the first encapsulation film and the opposed electrode have a common planar shape,
the first encapsulation film covers an upper surface of the opposed electrode and exposes an outer sidewall of the opposed electrode, such that the outer sidewall of the first encapsulation film and the outer sidewall of the opposed electrode are substantially coplanar,
a second encapsulation film covers an upper surface of the first encapsulation film, covers entire side surfaces of the opposed electrode and the first encapsulation film, and covers the exposed and substantially coplanar outer sidewalls of the first encapsulation film and the opposed electrode, and
wherein the active layer has a shape that is different from the common planar shape of the opposed electrode and the first encapsulation film, and the opposed electrode on the active layer covers an entirety of an upper surface of the active layer and an entirety of outer sidewalls of the active layer.

20. The method of claim 19, wherein the etching is performed based on at least one process of photolithography and dry etching.

21. The method of claim 19, further comprising:
forming a thin film associated with the second encapsulation film subsequently to forming the thin film associated with the first encapsulation film.

22. The method of claim 21, wherein the thin film associated with the second encapsulation film, the thin film associated with the first encapsulation film, and the conductive layer associated with the opposed electrode are simultaneously or sequentially etched to form the second encapsulation film, the first encapsulation film, and the opposed electrode such that the second encapsulation film, the first encapsulation film, and the opposed electrode have the common planar shape.

23. The method of claim 21, wherein the second encapsulation film is formed at a higher temperature than the first encapsulation film.

24. The method of claim 23, wherein
the first encapsulation film is formed at less than or equal to about 110° C., and
the second encapsulation film is formed at less than or equal to about 220° C.

25. The method of claim 22, further comprising forming a third encapsulation film on the second encapsulation film.

26. An electronic device, comprising:
a semiconductor substrate;
a plurality of photo-sensing devices integrated into the semiconductor substrate;
a photoelectric device on the semiconductor substrate, the photoelectric device including
a plurality of pixel electrodes on the semiconductor substrate, each pixel electrode vertically overlapping a separate set of one or more photo-sensing devices of the plurality of photo-sensing devices,
an active layer on the plurality of pixel electrodes, and
an opposed electrode on the active layer; and
a first encapsulation film on the opposed electrode,
wherein
the opposed electrode and the first encapsulation film have a common planar shape,
the first encapsulation film covers an upper surface of the opposed electrode and exposes an outer sidewall of the opposed electrode, such that the outer sidewall of the first encapsulation film and the outer sidewall of the opposed electrode are substantially coplanar,
a second encapsulation film covers an upper surface of the first encapsulation film, covers entire side surfaces of the opposed electrode and the first encapsulation film, and covers the exposed and substantially coplanar outer sidewalls of the first encapsulation film and the opposed electrode, and
the active layer has a shape that is different from the common planar shape of the opposed electrode and the first encapsulation film, and the opposed electrode on the active layer covers an entirety of an upper surface of the active layer and an entirety of outer sidewalls of the active layer.

27. The electronic device of claim 26, further comprising:
a color filter layer on the semiconductor substrate, the color filter layer including a plurality of color filters, each color filter of the plurality of color filters vertically overlapping a separate photo-sensing device of the plurality of photo-sensing devices.

28. The electronic device of claim 27, wherein
the photoelectric device is between the color filter layer and the plurality of photo-sensing devices,
the active layer is a light-absorbing layer that is configured to selectively absorb light in one wavelength spectrum of light of a red wavelength spectrum of light, a green wavelength spectrum of light, and a blue wavelength spectrum of light, and adjacent color filters of the plurality of color filters are configured to selectively transmit different wavelength spectra of mixed light of a plurality of wavelength spectra of mixed light, the different wavelength spectra of mixed light including both the one wavelength spectrum of light and different additional wavelength spectra of light, respectively.

29. The electronic device of claim 26, wherein a vertical area of the opposed electrode is larger than a vertical area of the active layer.

30. The electronic device of claim 26, wherein the first encapsulation film includes an oxide, a nitride, or an oxynitride.

31. The electronic device of claim 26, wherein the first encapsulation film has a thickness of about 2 nm to about 30 nm.

32. The electronic device of claim 26, wherein the second encapsulation film is on the first encapsulation film.

* * * * *